(12) United States Patent
Peng et al.

(10) Patent No.: US 9,960,513 B1
(45) Date of Patent: May 1, 2018

(54) ELECTRICAL CONNECTOR

(71) Applicant: LOTES CO., LTD, Keelung (TW)

(72) Inventors: Jian Min Peng, Keelung (TW); Ming Jui Tsai, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days. days.

(21) Appl. No.: 15/677,340

(22) Filed: Aug. 15, 2017

Related U.S. Application Data

(60) Provisional application No. 62/449,183, filed on Jan. 23, 2017.

(30) Foreign Application Priority Data

Apr. 13, 2017 (CN) .......................... 2017 1 0237888

(51) Int. Cl.
*H01R 12/88* (2011.01)
*H01R 33/97* (2006.01)
*H01R 13/62* (2006.01)
*H01R 13/629* (2006.01)

(52) U.S. Cl.
CPC .............. *H01R 12/88* (2013.01); *H01R 13/62* (2013.01); *H01R 13/62966* (2013.01); *H01R 13/62994* (2013.01); *H01R 33/97* (2013.01)

(58) Field of Classification Search
CPC .......................... H01R 12/88; H01R 13/62944
See application file for complete search history.

(56) References Cited

U.S. PATENT DOCUMENTS

| 8,506,316 | B2 * | 8/2013 | Tsai | ..................... H05K 7/1061 |
| | | | | 439/331 |
| 9,048,585 | B2 * | 6/2015 | Lin | .......................... G02B 6/00 |
| 9,466,900 | B1 * | 10/2016 | Heng | ........................ H05K 3/32 |
| 9,717,156 | B2 * | 7/2017 | Zhang | ..................... H05K 7/00 |
| 9,867,302 | B2 * | 1/2018 | Zhang | ..................... H05K 7/00 |
| 2007/0259543 | A1 * | 11/2007 | Hsieh | ................... G01R 1/0466 |
| | | | | 439/73 |

(Continued)

FOREIGN PATENT DOCUMENTS

CN 1761109 A 4/2006
CN 201887186 U 6/2011

(Continued)

*Primary Examiner* — James Harvey
(74) *Attorney, Agent, or Firm* — Locke Lord LLP; Tim Tingkang Xia, Esq.

(57) ABSTRACT

An electrical connector used for carrying a chip module includes an insulating body having terminals arranged in the insulating body and used for contacting the chip module, a carrying member used for carrying the chip module to the insulating body, a pressing plate used for pressing the carrying member or the chip module, and a positioning member pivoted to the carrying member through a pivoting device. The pivoting device includes a pivoting shaft and at least one elastic portion. The elastic portion includes a first elastic section and at least two limiting portions being elastic and enclosing a pivoting space. The pivoting shaft is pivoted to the pivoting space. When the electrical connector is opened, the first elastic section springs back to remove the chip module from the insulating body without damaging the terminals, so as to align and contact the chip module with the terminals without tool.

40 Claims, 24 Drawing Sheets

(56) References Cited

U.S. PATENT DOCUMENTS

| | | | | |
|---|---|---|---|---|
| 2012/0142209 | A1* | 6/2012 | Yeh | H01R 12/88 |
| | | | | 439/345 |
| 2012/0156919 | A1* | 6/2012 | Yeh | H01R 12/88 |
| | | | | 439/370 |
| 2013/0322037 | A1* | 12/2013 | Tan | H05K 7/10 |
| | | | | 361/752 |
| 2013/0344713 | A1* | 12/2013 | Yeh | H01R 12/88 |
| | | | | 439/68 |
| 2014/0011377 | A1* | 1/2014 | Yeh | H01R 13/62933 |
| | | | | 439/73 |
| 2017/0104286 | A1* | 4/2017 | Heng | H01R 12/88 |

FOREIGN PATENT DOCUMENTS

| | | |
|---|---|---|
| CN | 201966435 U | 9/2011 |
| CN | 103490208 A | 1/2014 |
| CN | 204088690 U | 1/2015 |
| CN | 205488736 U | 8/2016 |

* cited by examiner

ELECTRICAL CONNECTOR

CROSS-REFERENCE TO RELATED APPLICATION

This non-provisional application claims priority to and the benefit of, under 35 U.S.C. § 119(e), U.S. provisional patent application Ser. No. 62/449,183, filed Jan. 23, 2017, and under 35 U.S.C. § 119(a), Patent Application No. 201710237888.4 filed in P.R. China on Apr. 13, 2017, the entire content of which is hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates to an electrical connector, and more particularly to an electrical connector used for carrying a chip module.

BACKGROUND OF THE INVENTION

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An existing electrical connector used for carrying a chip module comprises an insulating body and multiple terminals fixedly arranged in the insulating body, a carrier being located on one side of the insulating body and used for carrying the chip module to contact the multiple terminals, a pressing plate being used for pressing the chip module until the chip module contacts the multiple terminals, and a base being located at the periphery of the insulating body.

At present, it is difficult to insert the chip module into the insulating body and to remove the chip module from the insulating body. On the market, the chip module can be in aligned fit with the terminals on the insulating body through a carrier. However, to remove the chip module from the insulating body, the terminals on the insulating body are easily damaged even if a special tool is adopted. And once the terminals are damaged, the insulating body must be replaced with a new one to fit the chip module.

Therefore, it is necessary to design an improved electrical connector to overcome the foregoing problem.

SUMMARY OF THE INVENTION

In view of the above problems in the related art, the present invention is directed to an electrical connector. By means of an elastic portion, the electrical connector may be in an opened or closed state at any time without other tools, thus avoiding damage to terminals due to misoperation.

To achieve the foregoing objective, the present invention uses the following technical means.

In one aspect, an electrical connector used for carrying a chip module comprises an insulating body, a carrying member used for carrying the chip module to the insulating body, a pressing plate used for pressing the carrying member or the chip module, and a positioning member. Multiple terminals are arranged in the insulating body and used for contacting the chip module. The positioning member is pivoted to the carrying member through a pivoting device. The pivoting device comprises a pivoting shaft and at least one elastic portion. The elastic portion comprises a first elastic section and at least two elastic limiting portions. The limiting portions is elastic, the two limiting portions enclose a pivoting space, and the pivoting shaft is pivoted to the pivoting space.

In certain embodiments, an elastic deformation direction of the limiting portions is different from that of the first elastic section.

In certain embodiments, the limiting portions elastically deform in lateral directions, and the first elastic section deforms elastically in a vertical direction.

In certain embodiments, the two limiting portions are arranged in a mutually staggered manner.

In certain embodiments, the two limiting portions are arranged opposite to each other, each limiting portion has an arc-shaped surface, and the two arc-shaped surfaces enclose a pivoting space.

In certain embodiments, the elastic portion is formed by extending from the positioning member, and the pivoting shaft is located on the carrying member.

In certain embodiments, the first elastic section extends from the positioning member, and the first elastic section is connected to the two limiting portions.

In certain embodiments, the elastic portion has a second elastic section, the first elastic section extends from the positioning member, the second elastic section bends and extends along a first vertical direction from the first elastic portion, and the second elastic section is connected to the first elastic section and the two limiting portions.

In certain embodiments, a bending portion is formed by bending and extending along a second vertical direction opposite to the first vertical direction from the positioning member, the first elastic portion horizontally extends from the bending portion, the second elastic portion along the first vertical direction from the first elastic section, and the two limiting portions are horizontally arranged with an interval between the two limiting portions at the tail end of the second elastic portion.

In certain embodiments, the positioning member has a buffer portion, and the buffer portion abuts against the pivoting shaft.

In certain embodiments, the pivoting shaft has an assembling plane and a stopping plane adjacent to each other. The carrying member has an assembling state and a buffer state. When the carrying member is in the assembling state, the assembling plane abuts against the buffer portion, and when the carrying member is in the buffer state, the stopping plane abuts against the buffer portion.

In certain embodiments, the buffer portion is located between the insulating body and the carrying member.

In certain embodiments, a bending portion is formed by bending and extending from the positioning member along a first vertical direction, the elastic connecting portion horizontally extends from the bending portion, the buffer portion is formed by bending from an elastic connecting section along a second vertical direction opposite to the first vertical direction, and the elastic connecting section is connected to the bending portion and the buffer portion.

In certain embodiments, the buffer portion bends and extends from the elastic connecting section along a lateral direction away from the positioning member.

In certain embodiments, the pivoting device comprises two elastic portions, the positioning member has a buffer portion, and the buffer portion is located between the two elastic portions and abuts against the pivoting shaft.

In certain embodiments, a buffer portion and the elastic portion are formed by extending from positioning member, respectively.

In certain embodiments, the elastic portion is formed by extending from the carrying member, the pivoting shaft is formed by extending from the positioning member, the first elastic section extends from the carrying member, and the first elastic section is connected to the limiting portion.

In certain embodiments, the elastic portion comprises two first elastic sections extending toward each other from two sides of the carrying member, respectively, and extension directions of the two first elastic sections are perpendicular to a rotating direction of the carrying member.

In certain embodiments, the positioning member bends and extends along a vertical direction to form a bending portion, an elastic connecting portion extends horizontally from the bending portion, and the elastic connecting portion bends and extends to form the pivoting shaft.

In certain embodiments, the carrying member has a buffer portion, the buffer portion abuts against the insulating body, the buffer portion is located on a side of the carrying member which is away from the elastic portion, the buffer portion comprises two elastic buffer arms, and the elastic buffer arms abuts against the insulating body.

In certain embodiments, a base is arranged at the periphery of the insulating body, the positioning member is soldered and fixed to the base, a buffer portion is fixed to the base and located opposite to the positioning member, and the buffer portion abuts against the carrying member.

In certain embodiments, the buffer portion has a main body portion, the main body portion is fixed to the base, two elastic arms extend from the main body portion along a direction toward the insulating body, an elastic buffer arm extends along a vertical direction from the elastic arm, and the elastic buffer arm abuts against the carrying member.

In certain embodiments, the pressing plate and the carrying member are located on two adjacent sides of the periphery of the insulating body, respectively.

In certain embodiments, the pressing plate has two opposite long sides and two opposite short sides, one of the short sides of the pressing plate serves as a pivoting side, the carrying member has two opposite long sides and two opposite short sides, and one of the long sides of the carrying member serves as a pivoting side.

In certain embodiments, a side of the carrying member which is away from the pivoting side is provided with at least one first guide portion, the first guide portion fits an outer wall surface of the insulating body and guides the carrying member to the insulating body.

In certain embodiments, the carrying member is provided with at least one second guide portion on each of two opposite short sides of the carrying member, the second guide portions fits an outer wall surface of the insulating body and guides the carrying member to the insulating body.

In certain embodiments, a base is arranged at the periphery of the insulating body, a first reinforcing member and a second reinforcing member are fixed to the base, the second reinforcing member is located on a side of the base opposite to a side of the base where the first reinforcing member is located, a first lever is pivoted to the first reinforcing member, a second lever is pivoted to the second reinforcing member, the pressing plate is pivoted to the first lever, the pressing plate has a projecting portion, the second lever is configured to press the projecting portion, two third guide portions extend from the first reinforcing member and the second reinforcing member, respectively, and the third guide portions fit an outer wall surface of the carrying member and guide the carrying member to be pressed to the insulating body.

In another aspect, an electrical connector used for carrying a chip module comprises an insulating body, a carrying member, used for carrying the chip module to the insulating body, a pressing plate used for pressing the carrying member or the chip module, and a positioning member. Multiple terminals arranged in the insulating body and used for contacting the chip module. The positioning member is pivoted to the carrying member through a pivoting device. The pivoting device comprises a pivoting shaft and an elastic portion. The elastic portion has a pivoting space. The pivoting shaft is pivoted to the pivoting space. When the pivoting shaft enters the pivoting space, the elastic portion elastically deforms for the first time, and when the pressing plate presses the carrying member or the chip module, the elastic portion elastically deforms for the second time.

In certain embodiments, the elastic portion comprises a first elastic section and at least two elastic limiting portions, the limiting portions are elastic, and the two limiting portions enclose a pivoting space.

In certain embodiments, when the pivoting shaft is pressed against the limiting portions, the limiting portions elastically deform, and when the pressing plate presses the carrying member or the chip module, the first elastic section elastically deforms.

In certain embodiments, an elastic deformation direction of the limiting portions is different from that of the first elastic section.

In certain embodiments, the limiting portions elastically deform in lateral directions, and the first elastic section deforms elastically in a vertical direction.

In certain embodiments, the two limiting portions are oppositely arranged in a mutually staggered manner.

In certain embodiments, the elastic portion is formed by extending from the positioning member, the pivoting shaft is arranged on the carrying member, the elastic portion comprises a first elastic section and at least two limiting portions, the first elastic section extends from the positioning member, and the first elastic section is connected to the two limiting portions.

In certain embodiments, the elastic portion has a second elastic section, and the second elastic section is connected to the first elastic section and the limiting portions.

In certain embodiments, a bending portion is formed by bending and extending from the positioning member along a first vertical direction, the first elastic portion horizontally extends from the bending portion, and the second elastic portion bends and extends from the first elastic section along a second vertical direction opposite to the first vertical direction.

In certain embodiments, the positioning member has a buffer portion, the buffer portion abuts against the pivoting shaft.

In certain embodiments, the pivoting shaft has an assembling plane and a stopping plane adjacent to each other. The carrying member has an assembling state and a buffer state. When the carrying member is in the assembling state, the assembling plane abuts against the buffer portion, and when the carrying member is in the buffer state, the stopping plane abuts against the buffer portion.

In certain embodiments, an elastic connecting section is formed by extending from the positioning member, and the buffer portion is connected to the elastic connecting section.

Compared with the related art, the present invention has the following beneficial effects.

In the present invention, a carrying member is pivoted to a positioning member through a pivoting device, the pivoting device comprises a pivoting shaft and two elastic portions, the elastic portion comprises a first elastic section and two limiting portions, the limiting portions are elastic, the two limiting portions enclose a pivoting space, and the pivoting shaft is pivoted to the pivoting space. When the pivoting shaft enters the pivoting space, the pivoting shaft is pressed against the limiting portion, such that the limiting portion laterally and elastically deforms for the first time, and it is large enough for the pivoting shaft to enter the pivoting space. When a pressing plate presses the carrying member or the chip module down, the electrical connector is closed, the first elastic section elastically deforms for the second time in a vertical direction. And when the electrical connector is opened, the first elastic section springs back to remove the chip module from the insulating body, so without a tool, the chip module can be aligned and contact with multiple terminals, and the chip module can be removed from the insulating body without damaging the terminals.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
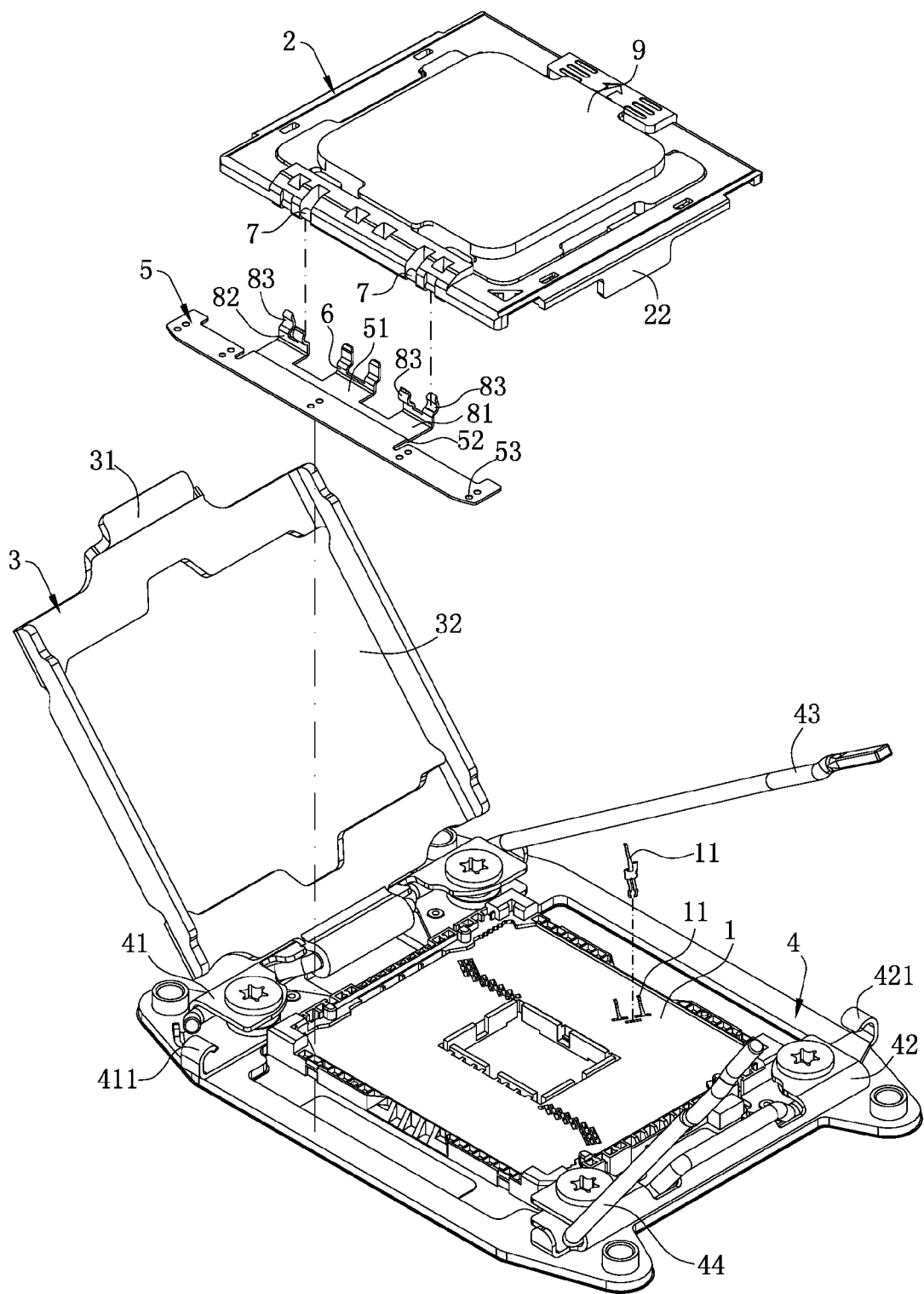
FIG. 1 is a three-dimensional exploded view of an electrical connector of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the disclosure or of any exemplified term. Likewise, the disclosure is not limited to various embodiments given in this specification.

Unless otherwise defined, all technical and scientific terms used herein have the same meaning as commonly understood by one of ordinary skill in the art to which this disclosure pertains. In the case of conflict, the present document, including definitions will control.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, "plurality" and/or "multiple" means two or more.

As used herein, the terms "comprising", "including", "carrying", "having", "containing", "involving", and the like are to be understood to be open-ended, i.e., to mean including but not limited to.

As used herein, the term "module" may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The terms "chip" or "computer chip", as used herein, generally refer to a hardware electronic component, and may refer to or include a small electronic circuit unit, also known as an integrated circuit (IC), or a combination of electronic circuits or ICs.

The description will be made as to the embodiments of the present invention in conjunction with the accompanying drawings in FIGS. 1-24. In accordance with the purposes of this invention, as embodied and broadly described herein, this invention, in one aspect, relates to an electrical connector.

Figure 5:
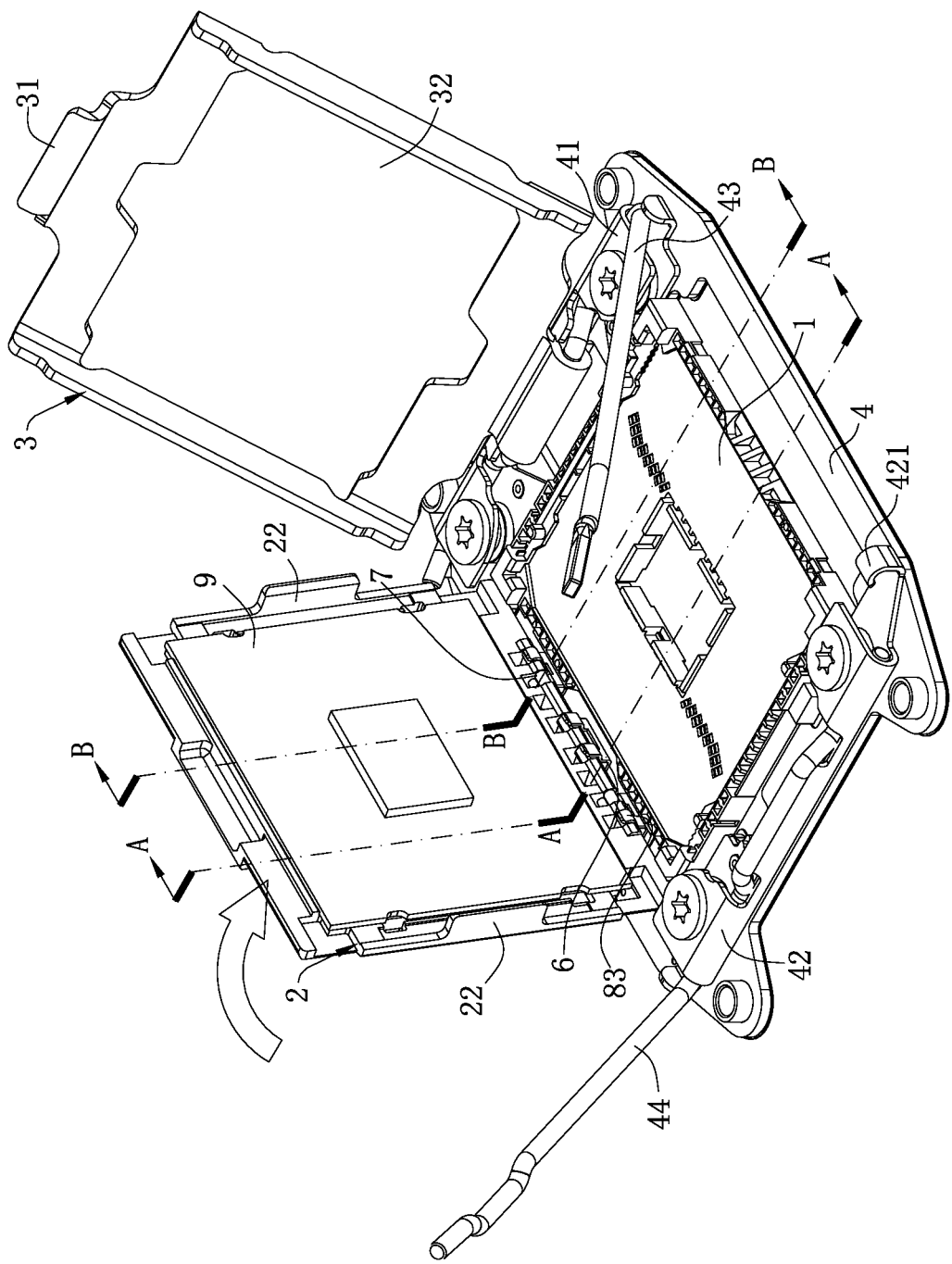
FIG. 5 is a three-dimensional assembled view of an electrical connector of the present invention.
Figure 20:
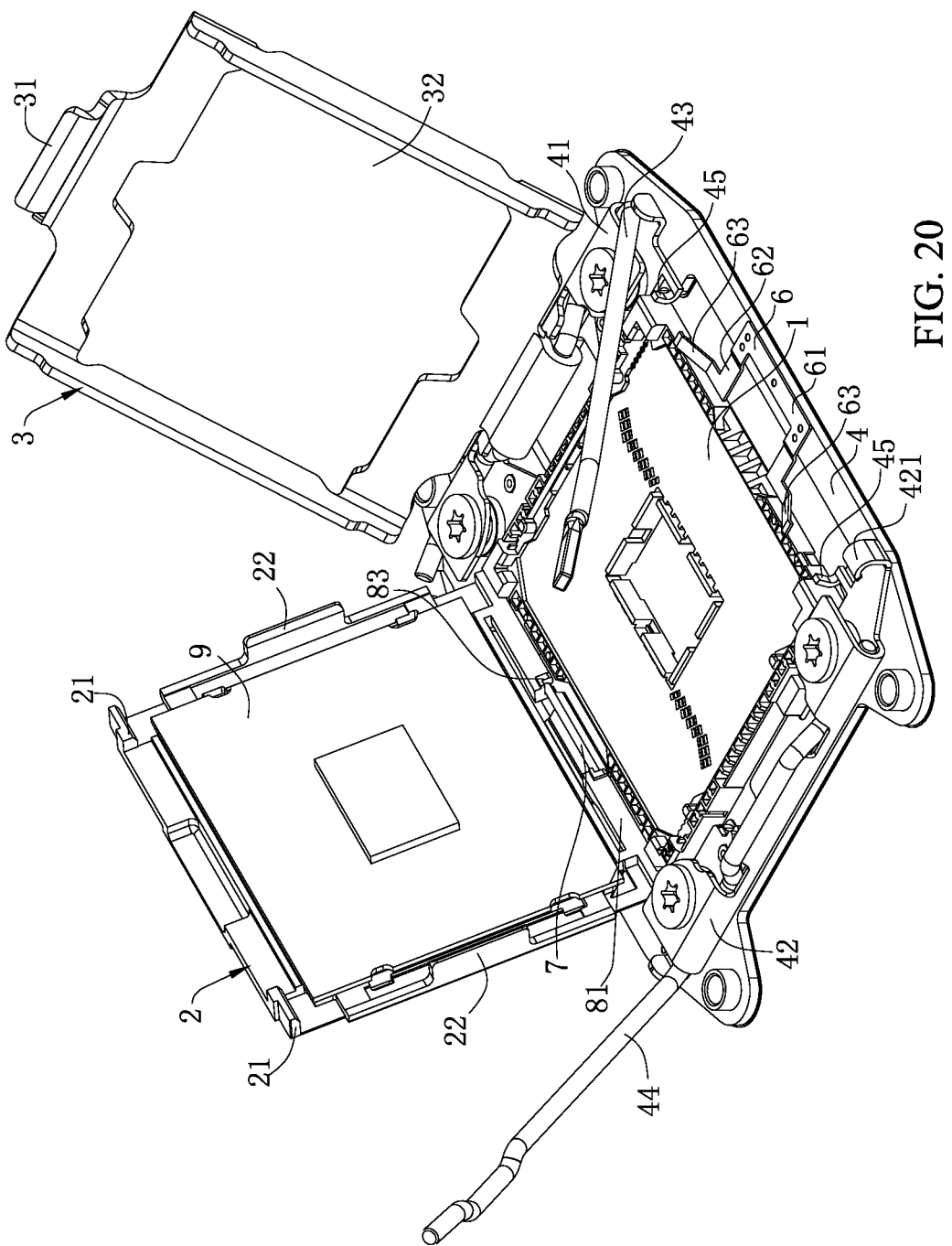
FIG. 20 is a structural diagram of a buffer portion and a third guide portion in a second embodiment for an electrical connector of the present invention.

As shown in FIG. 1, FIG. 5 and FIG. 20, an electrical connector of the present invention is used for carrying a chip module 9 and comprises an insulating body 1, a carrying member 2 used for carrying the chip module 9 to the insulating body 1, a pressing plate 3 used for pressing the carrying member 2 or the chip module 9, and a positioning member 5. Multiple terminals 11 are arranged in the insulating body 1 and used for contacting the chip module 9. The carrying member 2 is pivoted to the positioning member 5 through a pivoting device.

The pivoting device comprises a pivoting shaft 7 and at least two elastic portions 8. The elastic portion 8 comprises a first elastic section 81 and two limiting portions 83. The limiting portions 83 are elastic, the two limiting portions 83 enclose a pivoting space 84, and the pivoting shaft 7 is pivoted to the pivoting space 84. When the pivoting shaft 7 enters the pivoting space 84, the pivoting shaft 7 abuts against the limiting portion 83, such that the limiting portion 83 elastically deforms in a lateral direction for the first time, and when the pressing plate 3 presses the carrying member 2 or the chip module 9 down, the first elastic section 81 elastically deforms for the second time in a vertical direction.

Figure 2:
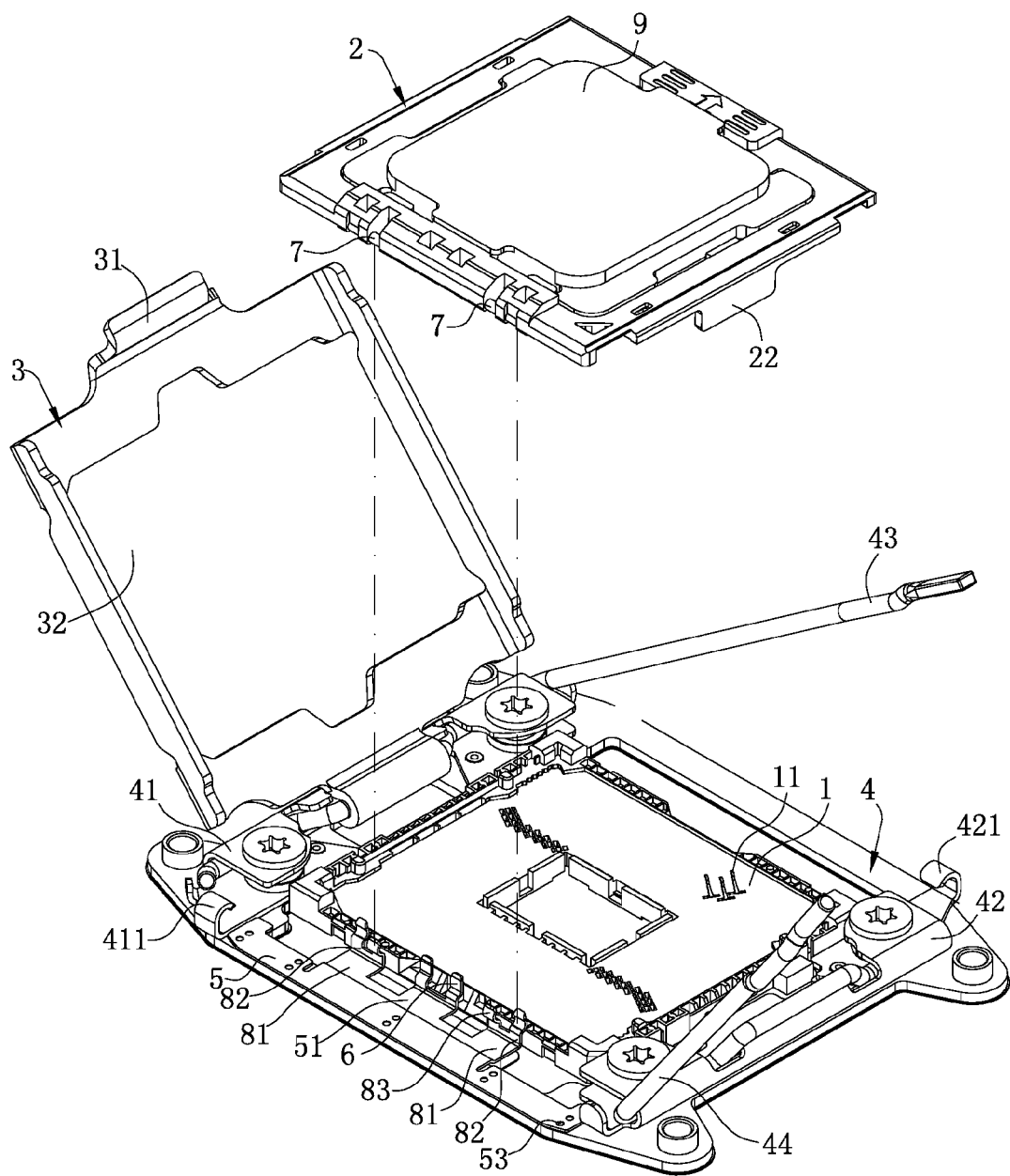
FIG. 2 is a three-dimensional exploded view of an electrical connector of the present invention viewed from another viewing angle.

FIG. 1 and FIG. 2 show a first embodiment of the present invention. The elastic portion 8 extends from the positioning member 5, and the pivoting shaft 7 is arranged on the carrying member 2. In the present embodiment, the elastic portion 8 comprises a first elastic section 81, two limiting portions 83 and a second elastic section 82. The positioning member 5 has a buffer portion 6, and the elastic portion 8 and the buffer portion 6 are formed by extending from the identical positioning member 5.

Figure 3:
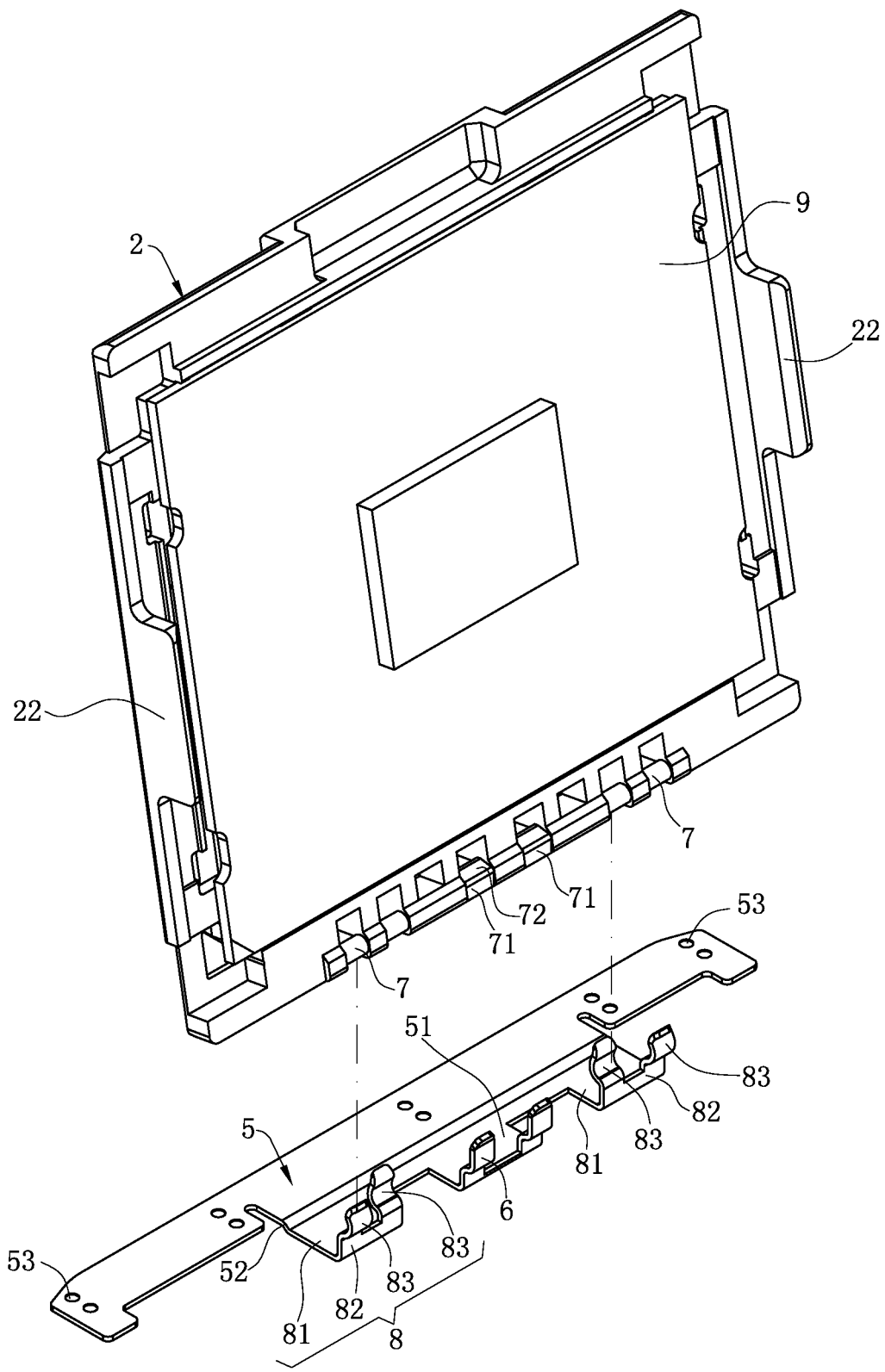
FIG. 3 is a structural diagram of a positioning member and a carrying member in a first embodiment for an electrical connector of the present invention.
Figure 4:
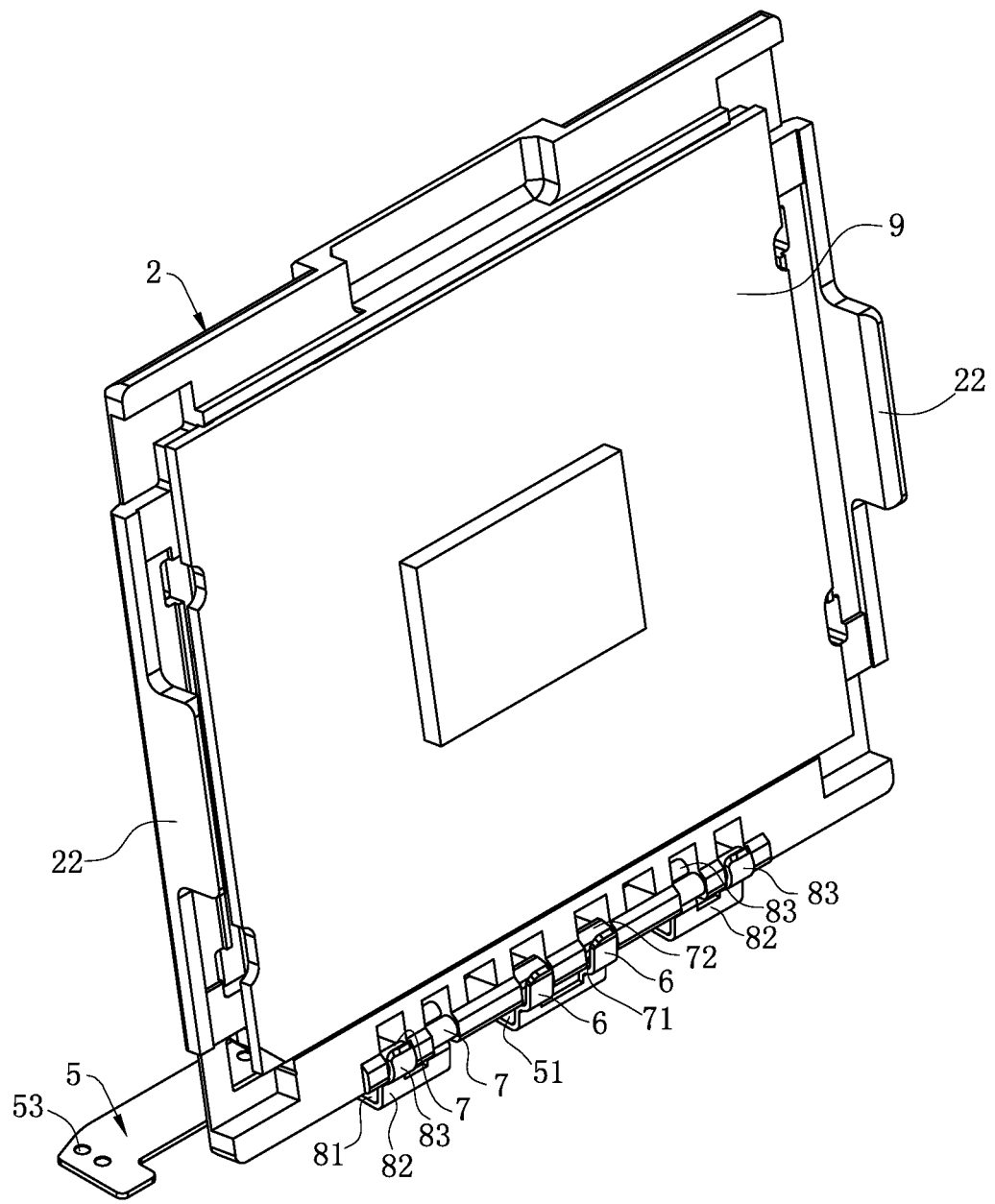
FIG. 4 is an assembled view of a positioning member and a carrying member in a first embodiment for an electrical connector of the present invention.

As shown in FIG. 3 and FIG. 4, the positioning member 5 bends and extends downwards to form three bending portions 52. The three bending portions 52 horizontally extend to form two first elastic sections 81 and an elastic connecting section 51 respectively, the elastic connecting section 51 is located between the two first elastic sections 81, the first elastic section 81 vertically bends and extends upwards to form a second elastic section 82, two limiting portions 83 extend from the second elastic section 82 in a staggered manner, the limiting portions 83 are elastic, the two limiting portions 83 are horizontally and oppositely arranged with an interval between the two limiting portion 83 at the tail end of the second elastic portion 82, the limiting portion 83 has an arc-shaped surface, and the two arc-shaped surfaces enclose a pivoting space 84. And the buffer portion 6 is formed by vertical upward bending and extension from the elastic connecting section 51, the buffer portion 6 bends and extends from the elastic connecting section 51 along a lateral direction away from the positioning member 5, the buffer portion 6 is located between the insulating body 1 and the carrying member 2, and the buffer portion 6 abuts against the pivoting shaft 7. In other embodiments, the elastic portion 8 may only comprise a first elastic section 81 and two limiting portions 83, the two limiting portions 83 extend from the first elastic section 81 in a staggered manner, and detailed descriptions will not be made herein.

As shown in FIG. 1 and FIG. 5, a base 4 is arranged at the periphery of the insulating body 1, the positioning member 5 is provided with multiple soldering portions 53, and the positioning member 5 and the base 4 are fixed by laser soldering from the soldering portions 53.

As shown in FIG. 1, FIG. 2 and FIG. 5, the carrying member 2 has two opposite long sides and two opposite short sides, the long side of the carrying member 2 serves as a pivoting side, the pivoting shaft 7 is located on the pivoting side of the carrying member 2, and the pivoting shaft 7 has an assembling plane 71 and a stopping plane 72 adjacent to each other. And each of the two short sides of the carrying member 2 is provided with a second guide portion 22, the second guide portion 22 has an inclined surface, and the second guide portion 22 fits an outer wall of the insulating body 1 and guides the carrying member 2 to be pivoted to the insulating body 1.

As shown in FIG. 1, the pressing plate 3 has two opposite long sides and two opposite short sides, the short side of the pressing plate 3 serves as a pivoting side, and the opposite side of the pivoting side of the pressing plate 3 is provided with a projecting portion 31. The pressing plate 3 and the carrying member 2 are located on two adjacent sides of the periphery of the insulating body 1, respectively, the pressing plate 3 has a frame opening 32, the chip module 9 protrudes upwards to be exposed to the frame opening 32, and the pressing plate 3 presses the chip module 9 or the carrying member 2.

Figure 16:
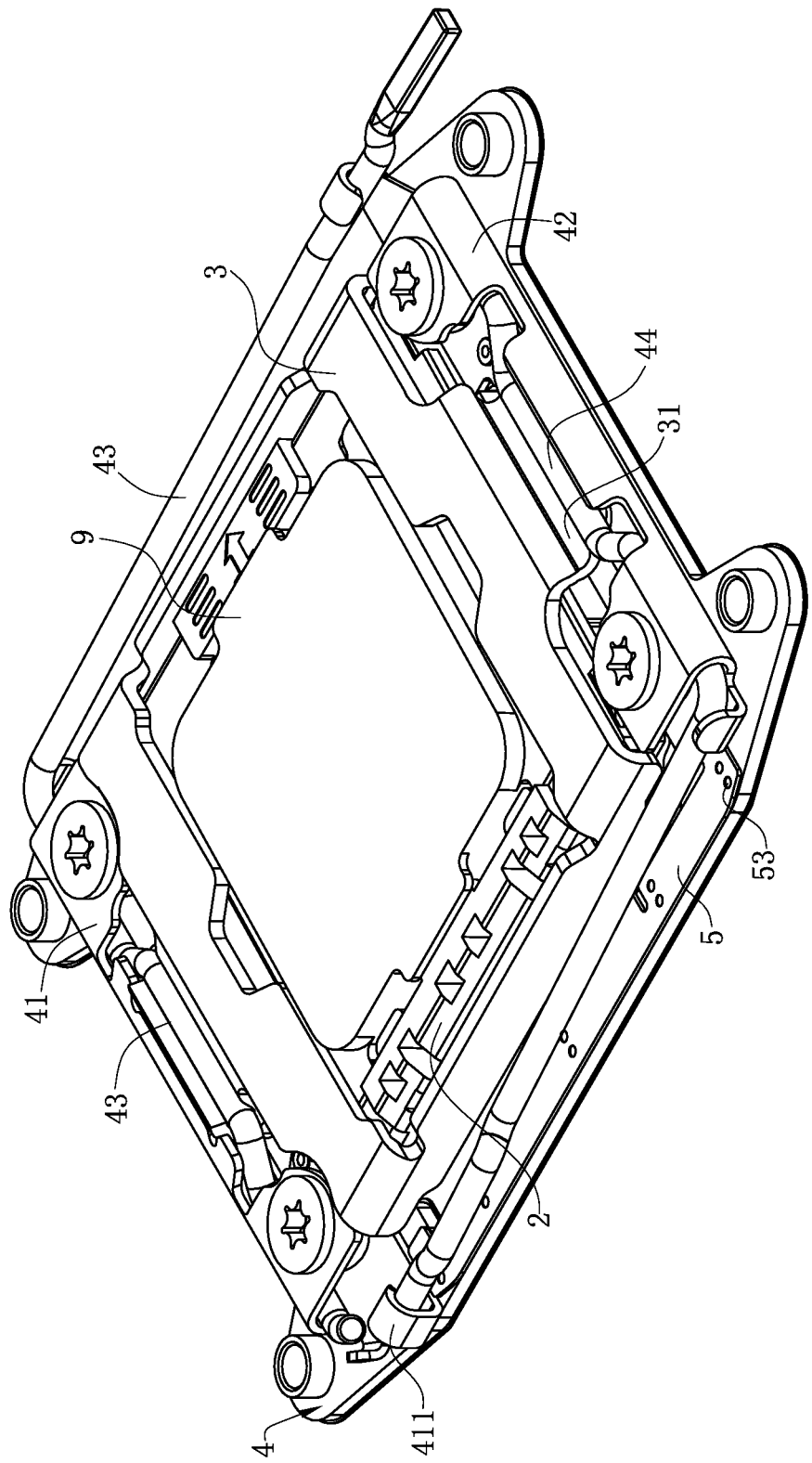
FIG. 16 is a structural diagram of an electrical connector of the present invention in a closed state.

As shown in FIG. 5 and FIG. 16, a first reinforcing member 41 and a second reinforcing member 42 are fixed to the base 4, the second reinforcing member 42 is located on a side of the base opposite to a side of the base where the first reinforcing member 41 is located, a first lever 43 is pivoted to the first reinforcing member 41, and a second lever 44 is pivoted to the second reinforcing member 42. The pressing plate 3 is pivoted to the first lever 43. The second lever 44 presses the projecting portion 31, the first reinforcing member 41 has a first clamping hook portion 411, the second reinforcing member 42 has a second clamping hook portion 421, the first lever 43 is hooked to the second clamping hook portion 421, and the second lever 44 is hooked to the first clamping hook portion 411.

Figure 6:
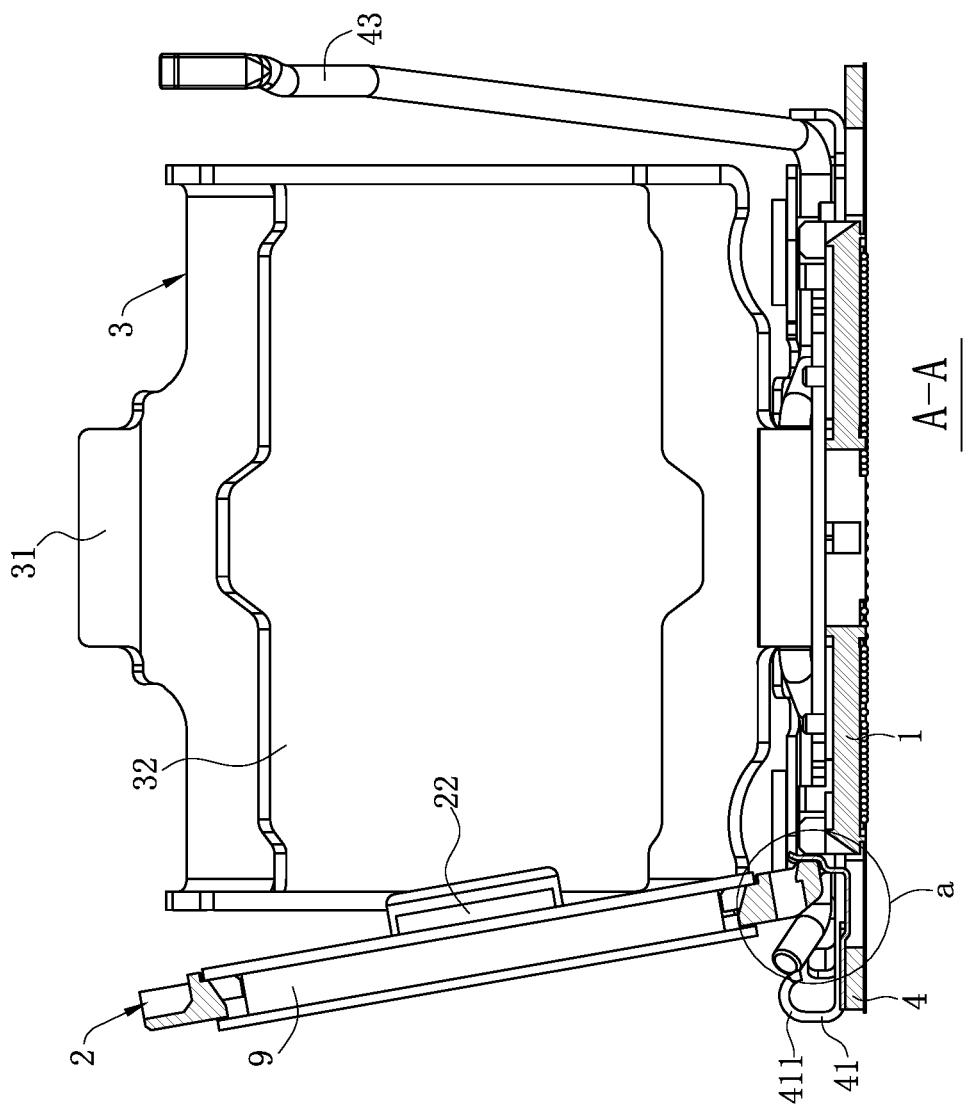
FIG. 6 is a sectional view of an electrical connector of the present invention in an assembling state in an A-A direction.
Figure 7:
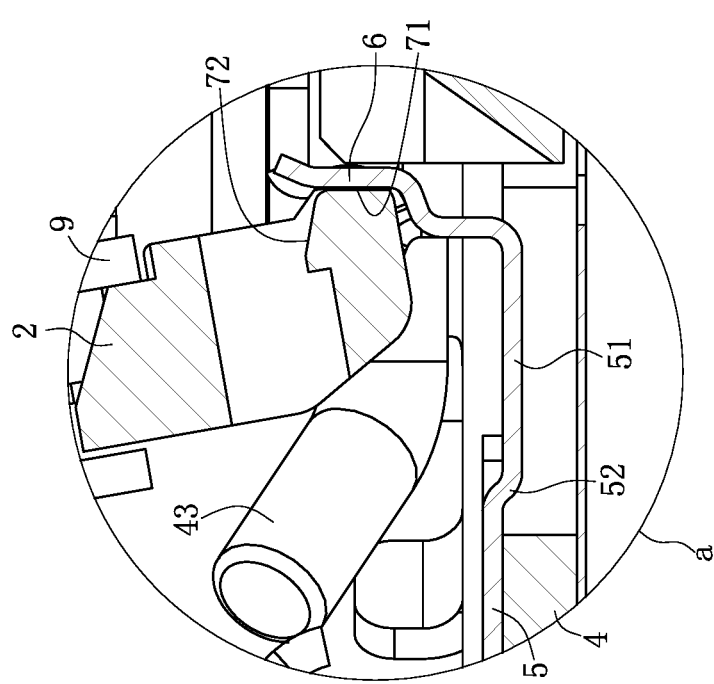
FIG. 7 is an enlarged view of a part a in FIG. 6.
Figure 8:
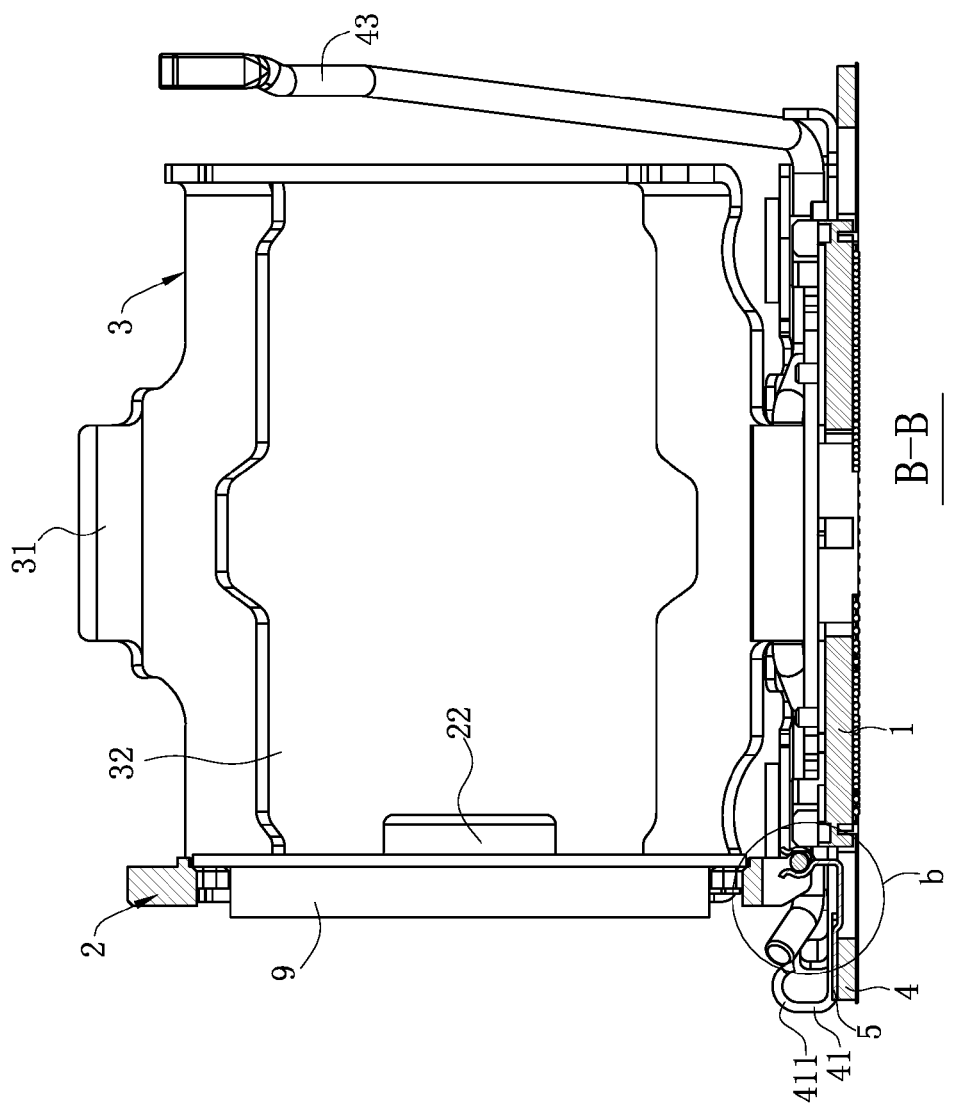
FIG. 8 is a sectional view of an electrical connector of the present invention in an assembling state in a B-B direction.
Figure 9:
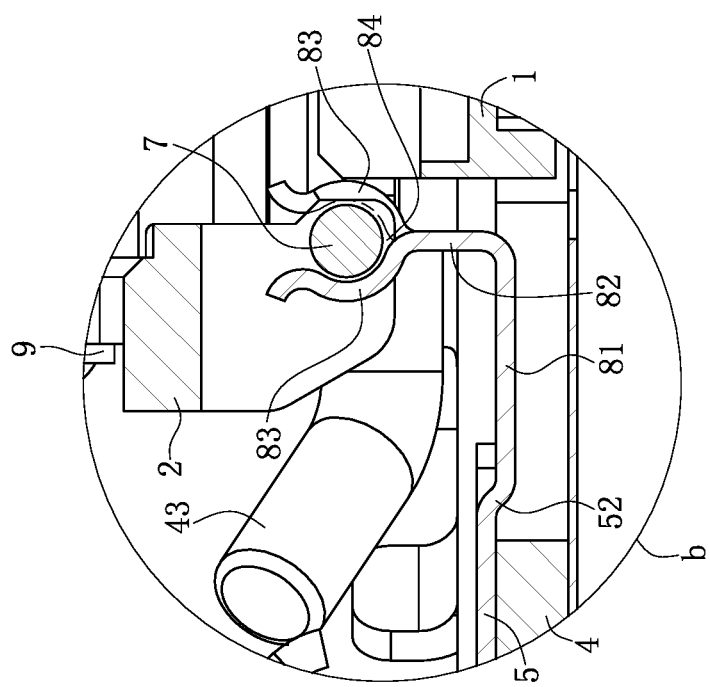
FIG. 9 is an enlarged view of a part b in FIG. 8.
Figure 10:
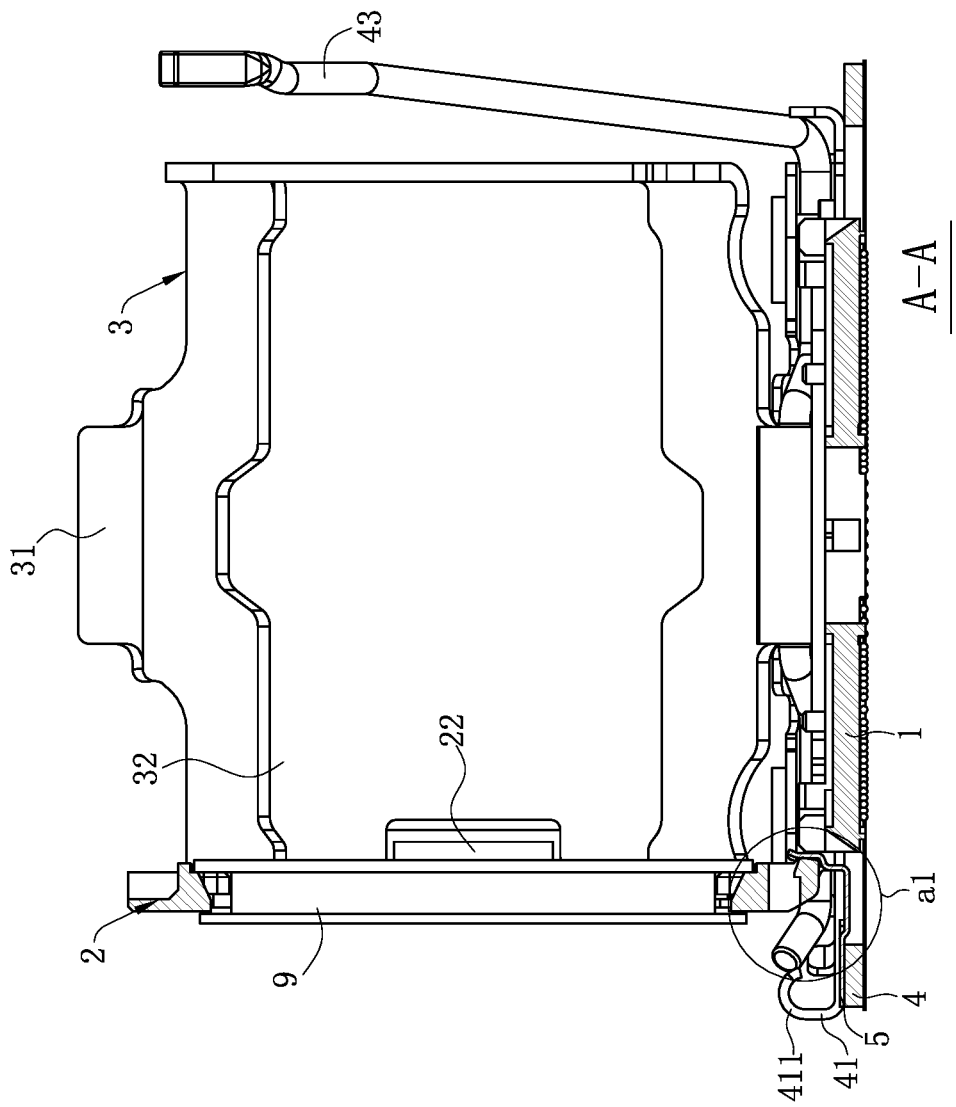
FIG. 10 is a sectional view of an electrical connector of the present invention in an assembling state in an A-A direction viewed from another viewing angle.
Figure 11:
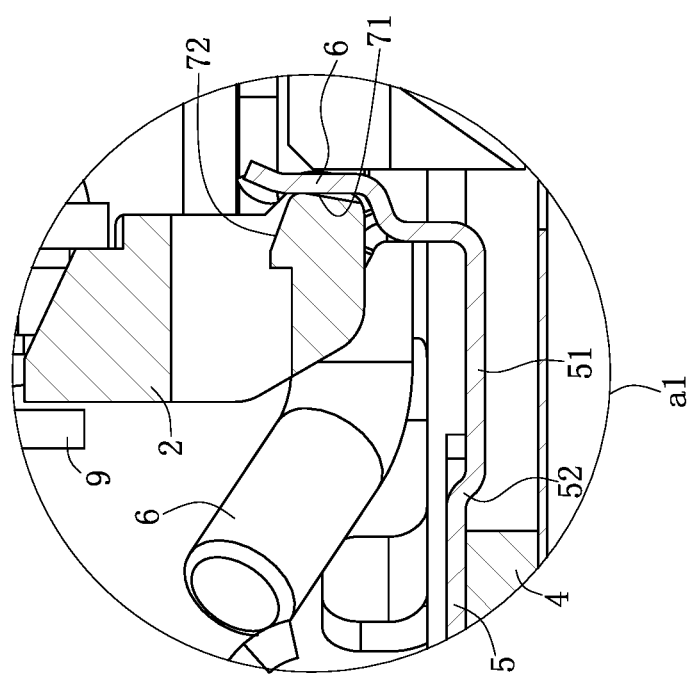
FIG. 11 is an enlarged view of a part a1 in FIG. 10.
Figure 12:
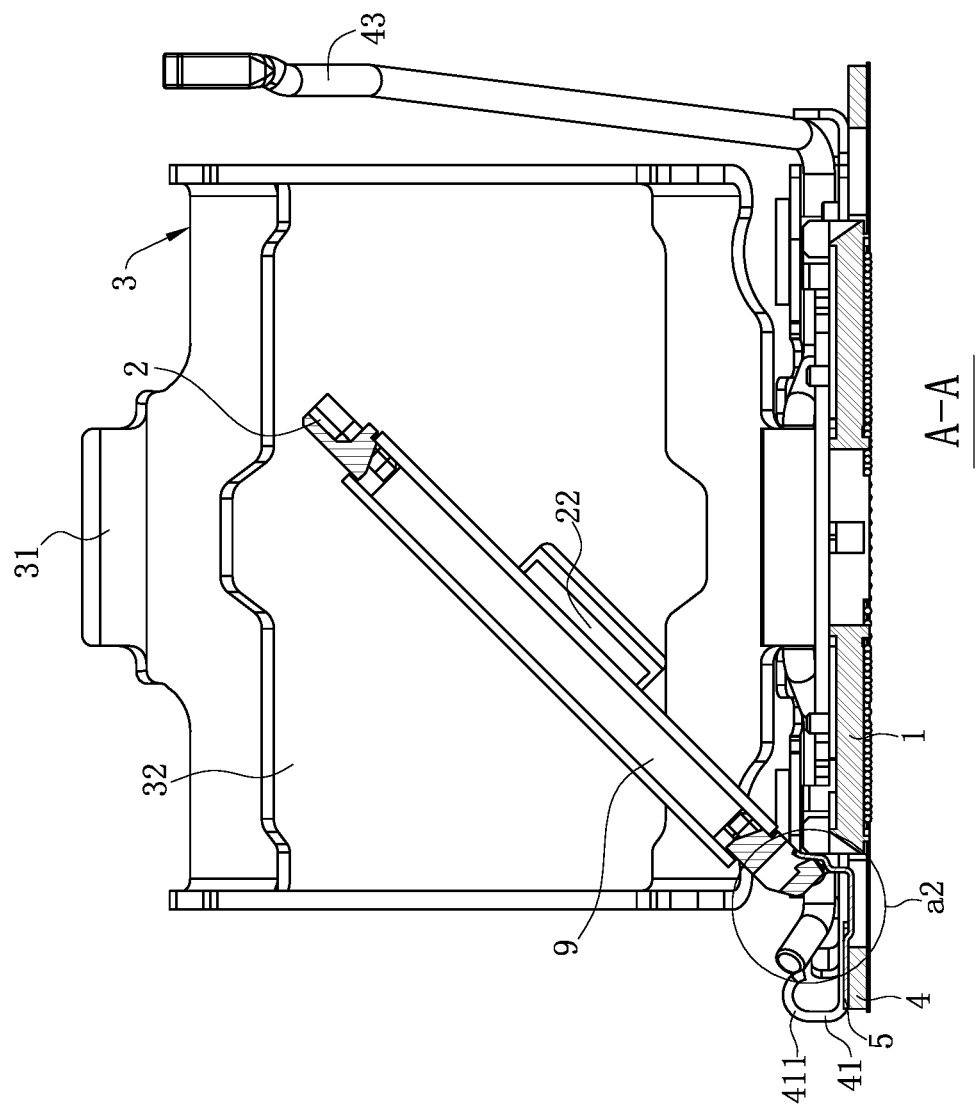
FIG. 12 is a sectional view of a carrying member of an electrical connector of the present invention during pivoting in an A-A direction.
Figure 13:
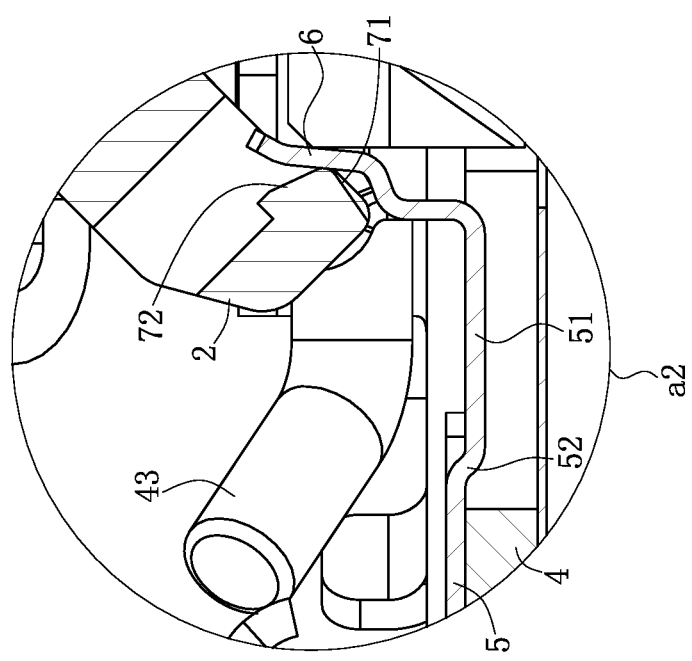
FIG. 13 is an enlarged view of a part a2 in FIG. 12.
Figure 14:
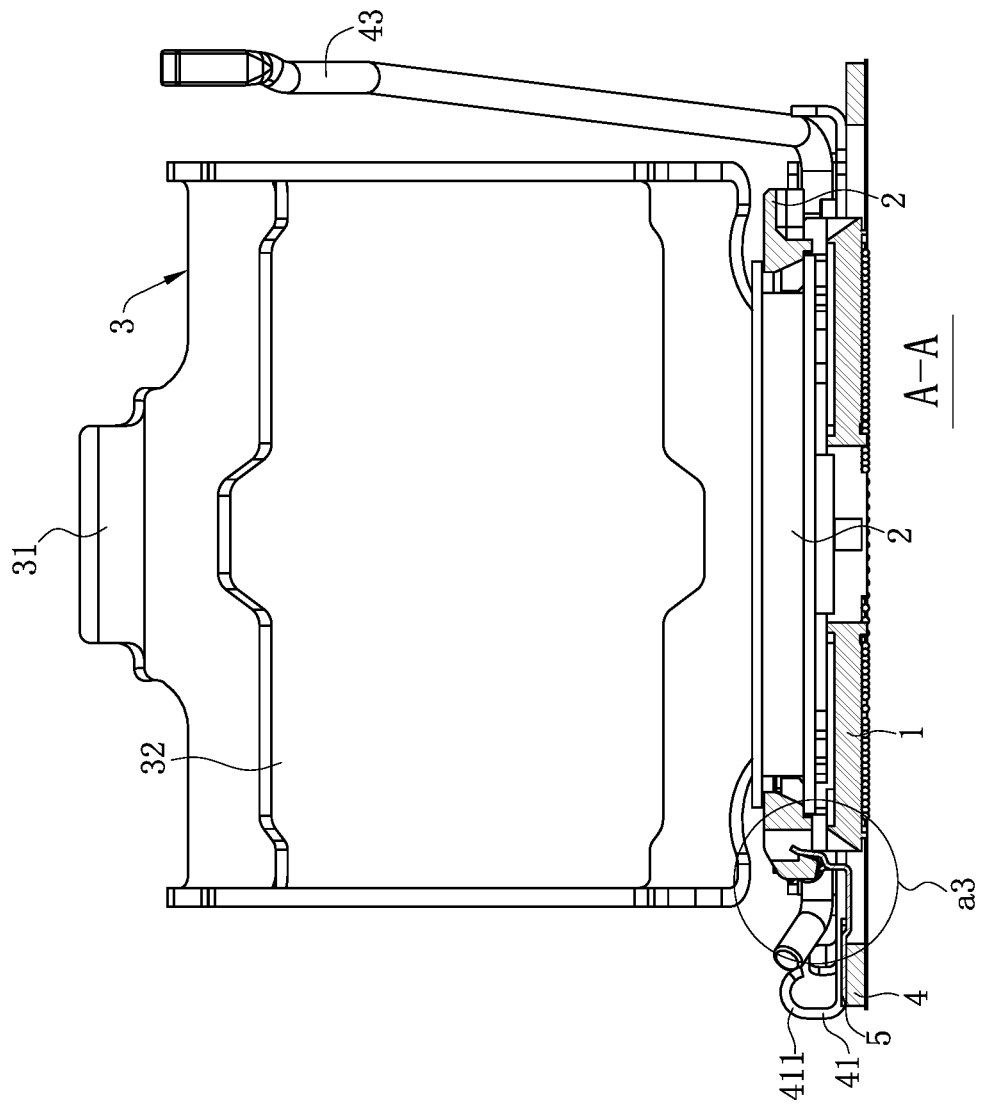
FIG. 14 is a schematic diagram of a carrying member carrying a chip module to an insulating body.
Figure 15:
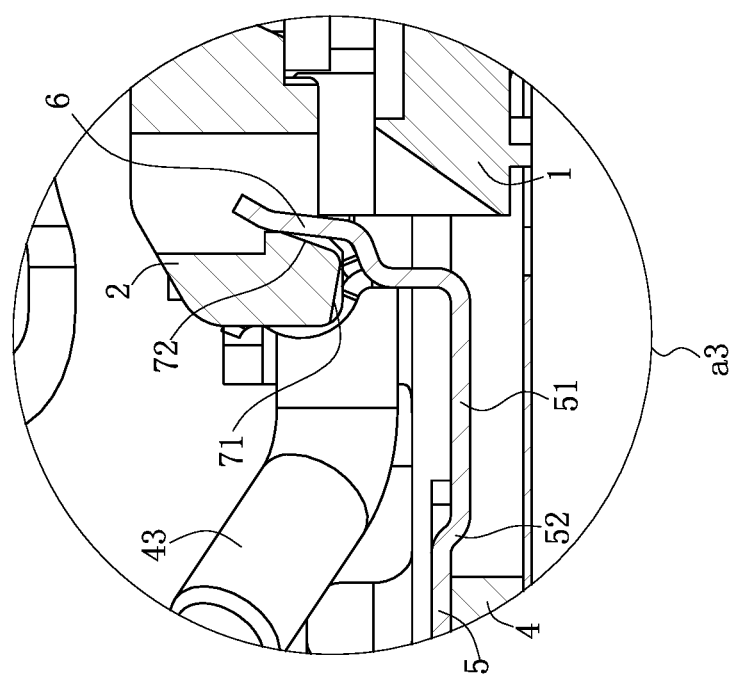
FIG. 15 is an enlarged view of a part a3 in FIG. 14.

As shown in FIG. 5, during assembly, the pivoting shaft 7 is pivoted to the pivoting space 84, the pivoting shaft 7 is pressed against the limiting portion 83 to make the limiting portion 83 elastically deform in a lateral direction, and the limiting portion 83 elastically deforms for the first time, so a place is made large enough for the pivoting shaft 7 to enter the pivoting space 84 (as shown in FIG. 8 and FIG. 9), and the chip module 9 is assembled into the carrying member 2. In this case, the electrical connector is in an assembling state, and the assembling plane 71 abuts against the buffer portion 6 (as shown in FIG. 6 and FIG. 7); when the carrying member 2 carries the chip module 9 to pivot down, as the carrying member 2 is pressed down, the assembling plane 71 rotates to transit to the stopping plane 72 (as shown in FIG. 10, FIG. 11, FIG. 12 and FIG. 13), when the stopping plane 72 abuts against the buffer portion 6, the buffer portion 6 stops the carrying member 2 from continuously moving, and in this case, the electrical connector is in a buffer state to prevent the carrying member 2 from suddenly pressing down to damage the terminals 11. In this case, the pressing plate 3 is pressed down, the pressing plate 3 presses the carrying member 2 or the chip module 9 down, and the stopping plane 72 is continuously pressed against the buffer portion 6 to make the buffer portion 6 deform (as shown in FIG. 14 and FIG. 15). Meanwhile, the first elastic section 81 is stressed down to elastically deform for the second time, the axis of the pivoting shaft 7 moves down, the second lever 44 is operated to make the second lever 44 press the projecting portion 31, the second lever 44 is hooked to the first clamping hook portion 411. Then the first lever 43 is operated, and the first lever 43 is hooked to the second clamping hook portion 421 to make the electrical connector in a closed state (as shown in FIG. 16). When the electrical connector is opened, the first lever 43 is moved out of the second clamping hook portion 421, and then the second lever 44 is moved out of the first clamping hook portion 411. In this case, the carrying member 2 or the chip module 9 is not pressed by the pressing plate 3, the first elastic section 81 moves up vertically to restore to a state before elastic deformation, the pivoting shaft 7 likewise returns to a position before pressing, that is, the electrical connector returns to a buffer state, so the electrical connector may be in a buffer state or a closed state at any time, and the chip module 9 is moved out of the insulating body 1 and cannot damage the terminals 11 on the insulating body 1.

Figure 19:
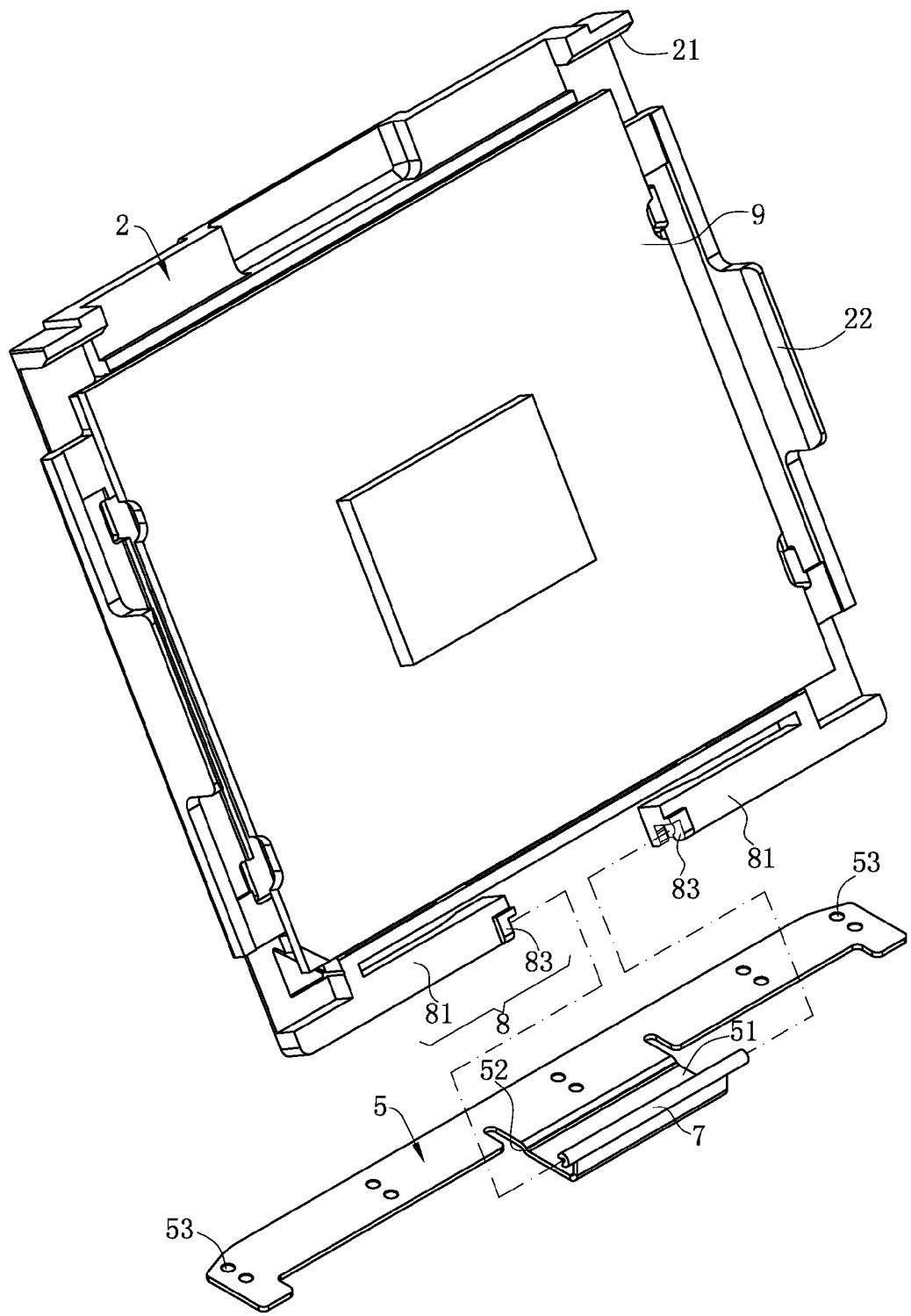
FIG. 19 is a structural diagram of a positioning member and a carrying member in a second embodiment for an electrical connector of the present invention.
Figure 21:
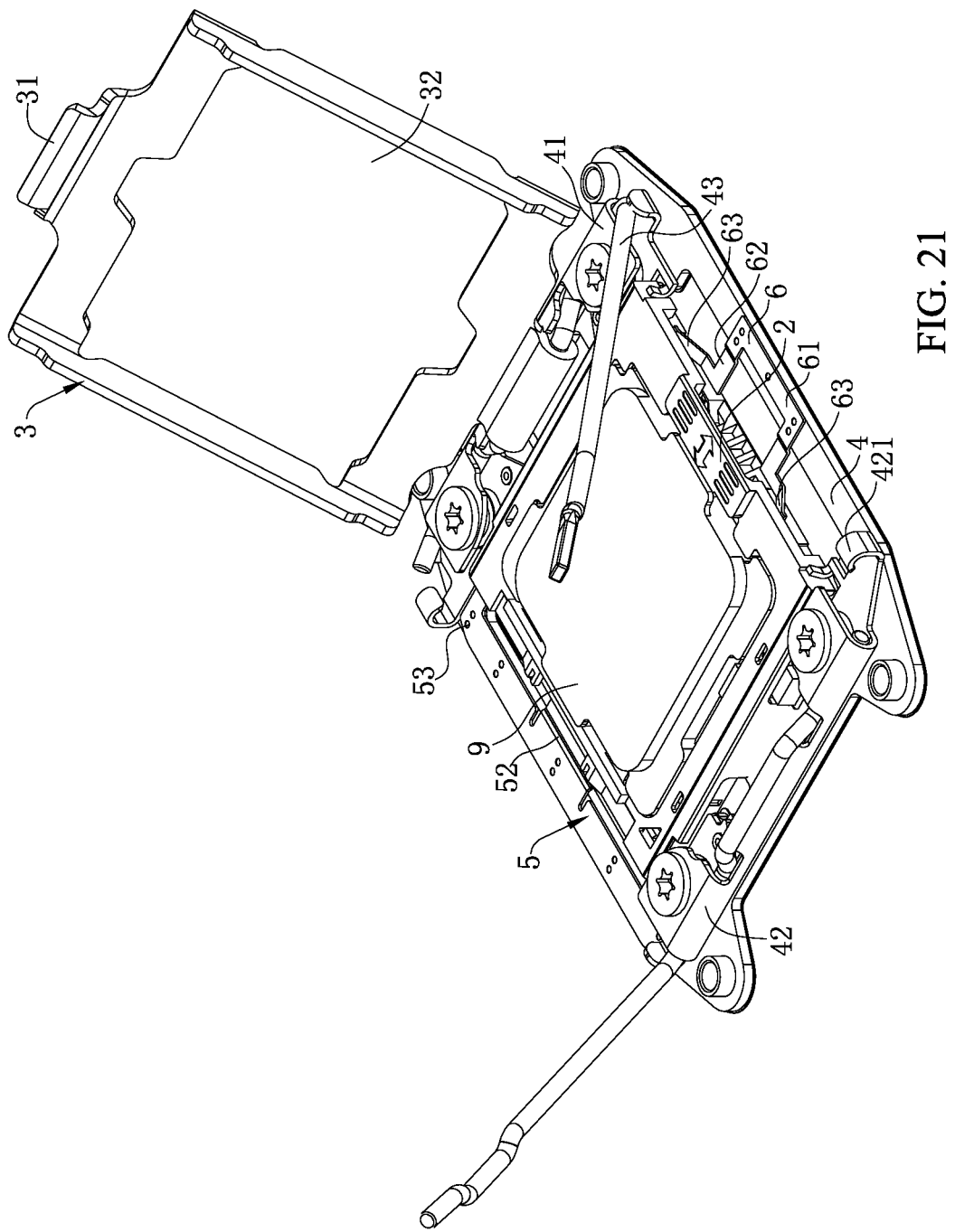
FIG. 21 is a structural diagram of a fit between a buffer portion and a carrying member in a second embodiment for an electrical connector of the present invention.
Figure 22:
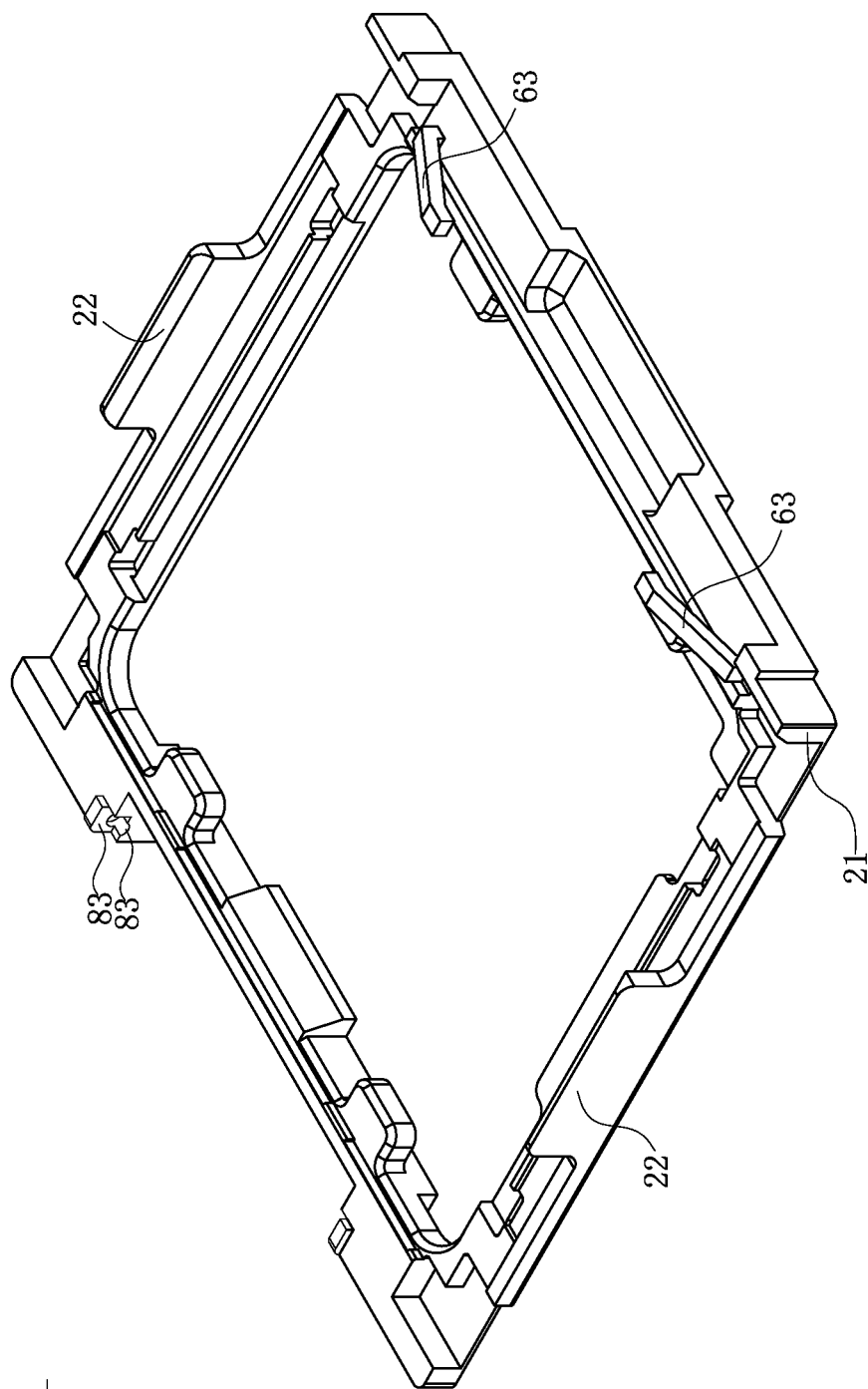
FIG. 22 is a structural diagram of another buffer portion on a carrying member.
Figure 23:
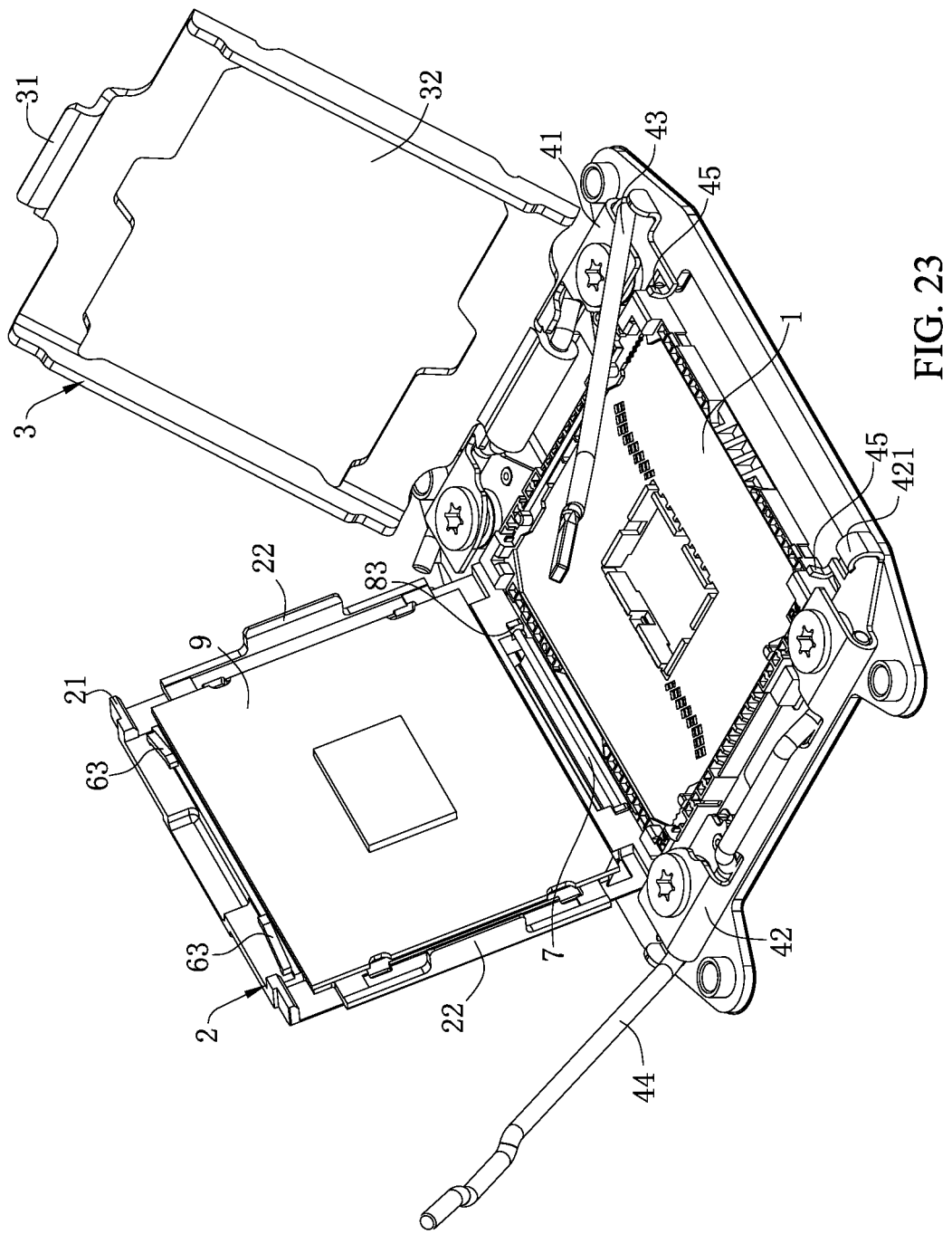
FIG. 23 is a structural diagram of another buffer portion and a third guide portion in a second embodiment for an electrical connector of the present invention.
Figure 24:
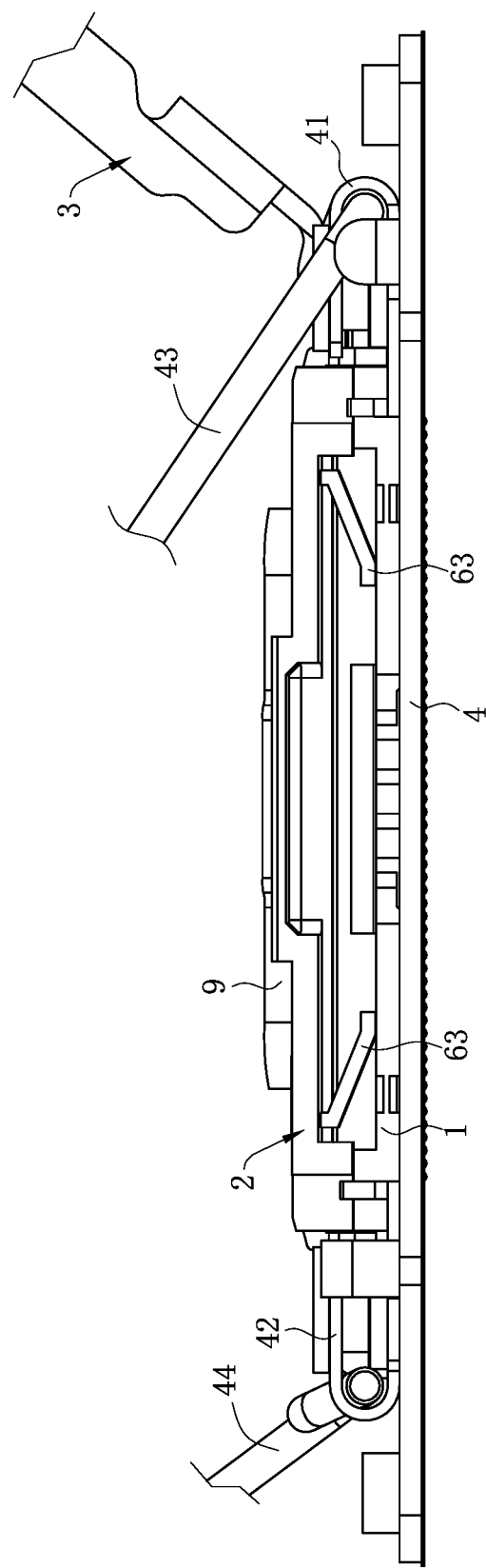
FIG. 24 is a structural diagram of a fit between another buffer portion and an insulating body.

Different from the first embodiment, a second embodiment of the present invention is characterized in that, as shown in FIG. 19 and FIG. 20, an elastic portion 8 is formed by extending from a carrying member 2, a pivoting shaft 7 is formed by extending from a positioning member 5, two first elastic sections 81 and two limiting portions 83 extend from the carrying member 2, and the first elastic sections 81 are connected to the two limiting portions 83. There are two first elastic sections 81 extending toward each other from two sides of the carrying member 2, and extension directions of the two first elastic sections 81 are perpendicular to a rotating direction of the carrying member 2. The positioning member 5 bends and extends downwards to form a bending portion 52, an elastic connecting section 51 is formed by horizontal extending from the bending portion 52, and the elastic connecting section 51 bends up vertically to form the pivoting shaft 7. A buffer portion 6 is located opposite to the positioning member 5, and has a main body portion 61 fixed to a base 4, two elastic arms 62 extend from the main body portion 61 along the direction toward the insulating body 1, and an elastic buffer arm 63 laterally extends up from each of the two elastic arms 62. When the carrying member 2 pivots to the insulating body 1, the elastic buffer arms 63 upwards abut against the carrying member 2 to exert a buffer force on the carrying member 2 (as shown in FIG. 21). In other embodiments, as shown in FIG. 22 and FIG. 23, the buffer portion 6 may also be arranged on a side of the carrying member 2 that is away from the elastic portion 8, specifically, two elastic buffer arms 63 extend toward each other and when the carrying member 2 pivots to the insulating body 1, the elastic buffer arms 63 abut against the insulating body 1 (as shown in FIG. 24) to buffer the down pressing of the carrying member 2.

During assembly, the pivoting shaft 7 is pivoted to the pivoting space 84, the pivoting shaft 7 is pressed against the limiting portion 83 to make the limiting portion 83 and elastically deform in a lateral direction, the limiting portion 83 elastically deforms for the first time, the chip module 9 is assembled into the carrying member 2, the carrying member 2 carries the chip module 9 to pivot down, and when the elastic buffer arm 63 abuts against the carrying member 2, the electrical connector is in a buffer state to prevent the carrying member 2 from suddenly pressing down to damage the terminals 11. In this case, the pressing plate 3 is pressed down, the pressing plate 3 presses the carrying member 2 or the chip module 9 down, and the carrying member 2 is continuously pressed against the elastic buffer arm 63 to make the elastic buffer arm 63 deform. Meanwhile, the first elastic section 81 is stressed down to elastically deform for the second time, the second lever 44 is operated to make the second lever 44 press the projecting portion 31, and the second lever 44 is hooked to the first clamping hook portion

411. Then the first lever 43 is operated, and the first lever 43 is hooked to the second clamping hook portion 421 to make the electrical connector in a closed state. When the electrical connector is opened, the first lever 43 is moved out of the second clamping hook portion 421, and then the second lever 44 is moved out of the first clamping hook portion 411. In this case, the carrying member 2 or the chip module 9 is not pressed by the pressing plate 3, the first elastic section 81 moves up vertically to be restored to a state before elastic deformation, that is, the electrical connector returns to a buffer state, so the electrical connector may be in a buffer state or a closed state at any time, and the chip module 9 is moved out of the insulating body 1 and cannot damage the terminals 11 on the insulating body 1.

Figure 17:
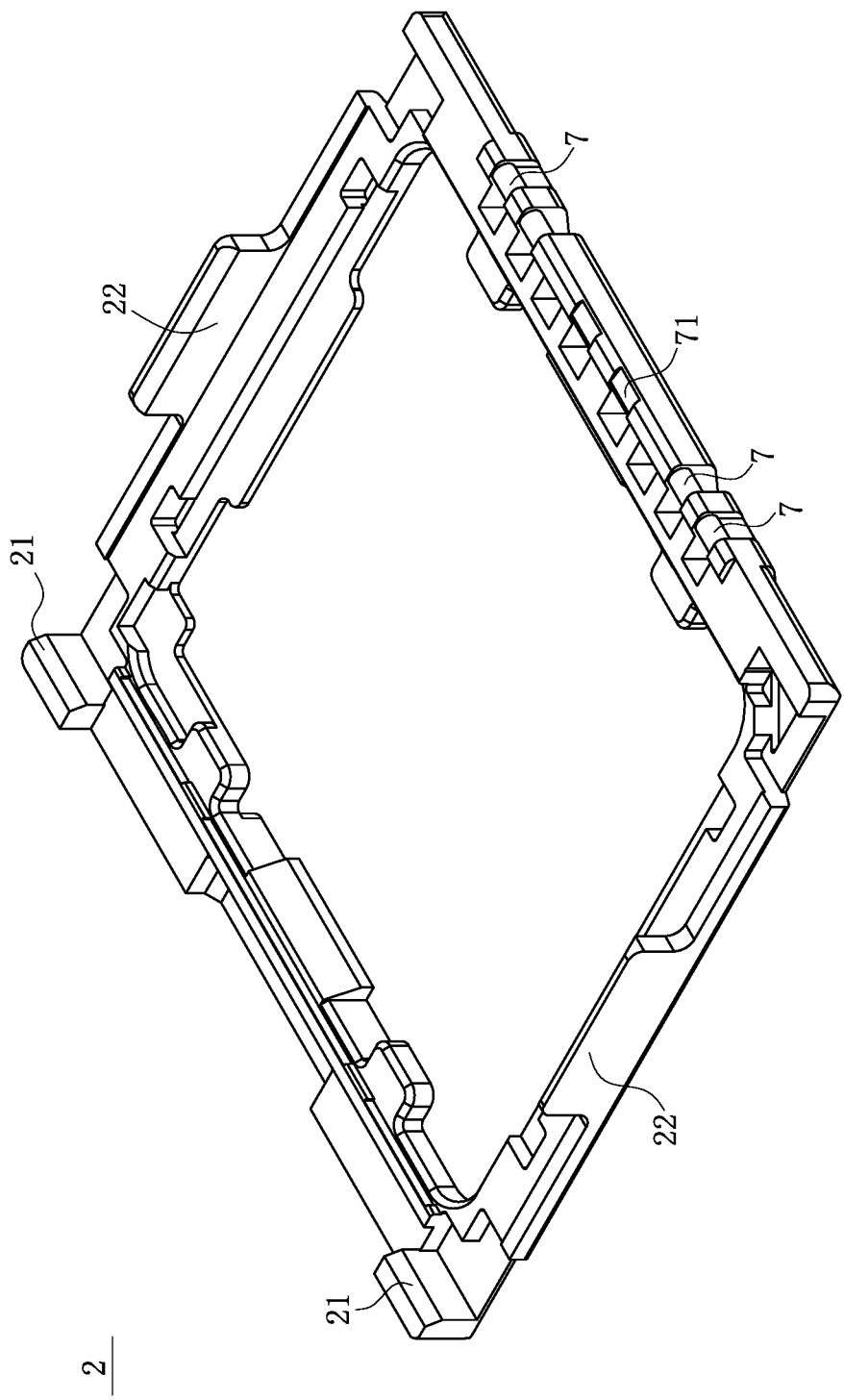
FIG. 17 is a structural diagram of a first guide portion on a carrying member.
Figure 18:
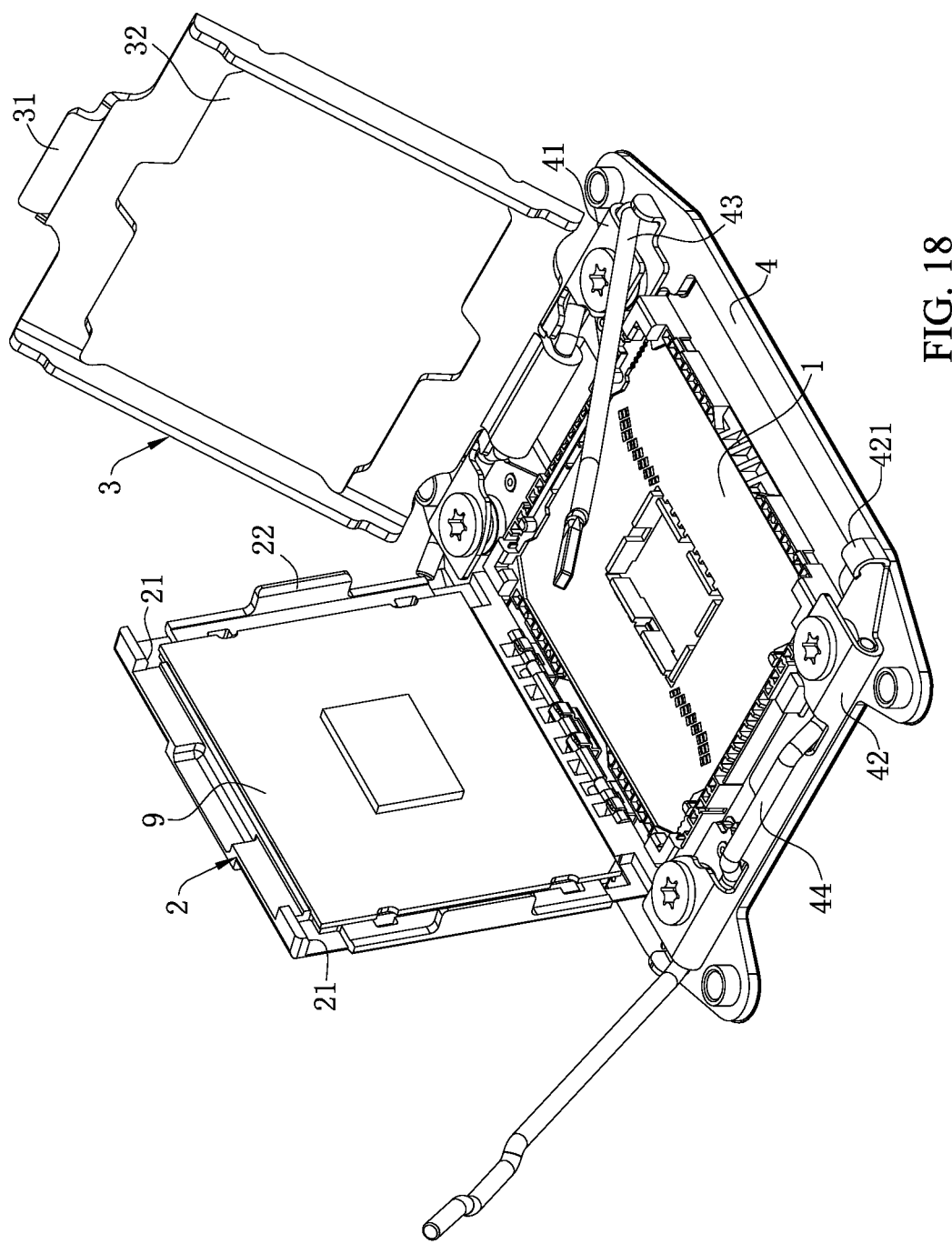
FIG. 18 is a three-dimensional assembled view of an electrical connector additionally provided with a first guide portion.

As shown in FIG. 17, FIG. 18 and FIG. 20, the carrying member 2 also has two first guide portions 21 arranged on a side of the carrying member 2 that is away from the pivoting side. The first guide portion 21 has an inclined surface, the first guide portion 21 fits an outer wall surface of the insulating body 1 and guides the carrying member 2 to pivot to the insulating body 1. third guide portions 45 extend from the first reinforcing member 41 and the second reinforcing member 42, respectively (as shown in FIG. 20 and FIG. 21), the third guide portion 45 fits an outer wall surface of the carrying member 2 and guides the carrying member 2 to pivot to the insulating body 1. The first guide portions 21, the second guide portions 22 and the third guide portions 45 may exist simultaneously or may be arranged individually, and detailed descriptions will not be made herein.

To sum up, the electrical connector of the present invention has the following beneficial effects.

(1) In the present invention, a carrying member 2 is pivoted to a positioning member 5 through a pivoting device, and the pivoting device comprises a pivoting shaft 7 and two elastic portions 8. The elastic portion 8 comprises a first elastic section 81 and two limiting portions 83. The limiting portions 83 are elastic, the two limiting portions 83 enclose a pivoting space 84, and the pivoting shaft 7 is pivoted to the pivoting space 84. When the pivoting shaft 7 enters the pivoting space 84, the pivoting shaft 7 is pressed against the limiting portion 83, such that the limiting portion 83 elastically deforms in a lateral direction for the first time, and the space made is large enough for the pivoting shaft 7 to enter the pivoting space 84. When a pressing plate 3 presses the carrying member 2 or the chip module 9 down, the electrical connector is closed, the first elastic section 81 elastically deforms for the second time in a vertical direction. When the electrical connector is opened, the first elastic section 81 springs back to remove the chip module 9 out of the insulating body 1, so without a tool, the chip module 9 can be in aligned contact with multiple terminals 11, and the chip module 9 can be removed from the insulating body 1 without damaging the terminals 11.

(2) The elastic portion 8 is formed by extending from the positioning member 5, the pivoting shaft 7 is arranged on the carrying member 2, the elastic portion 8 comprises a first elastic section 81 and two limiting portions 83, the limiting portions 83 are elastic, the two limiting portions 83 enclose a pivoting space 84, and the pivoting shaft 7 is pivoted to the pivoting space 84. Compared with an existing complicated pivoting device, the pivoting structure is simple in design, more convenient to assemble, and cost-saving.

(3) By arranging the carrying member 2 and the pressing plate 3 on two adjacent sides of the periphery of the insulating body 1, the electrical connector of the present invention has an enough assembling space, all components do not influence each other, the assembling efficiency is improved, and assembling is more convenient. Meanwhile, one long side of the carrying member 2 serves as the pivoting side, thus lowering the center of gravity of the carrying member 2. When the carrying member 2 carries the chip module 9 to press down, the down pressure of the carrying member 2 is reduced. It is ensured that the buffer portion 6 has an enough buffer force to buffer the down pressing of the carrying member 2. The carrying member 2 is prevented from carrying the chip module 9 to directly hit against the terminals 11 on the insulating body 1, and the risk of misoperation is reduced.

(4) The side of the carrying member 2 which is away from the pivoting side is provided with two first guide portions 21, each of the two short sides of the carrying member 2 is provided with a second guide portion 22, the first guide portion 21 and the second guide portion 22 have an inclined surface, the first guide portion 21 and the second guide portion 22 fit the outer wall of the insulating body 1 and guide the carrying member 2 to press down to the insulating body 1, and the first guide portion 21 or the second guide portion 22 may be arranged individually, so when the carrying member 2 pivots to the insulating body 1, fitting is more convenient, and positioning is more accurate.

(5) Third guide portions 45 extend from the first reinforcing member 41 and the second reinforcing member 42, respectively, the first guide portion 45 fits the outer wall surface of the carrying member 2 and guides the carrying member 2 to the insulating body 1, the first guide portions 21, the second guide portions 22 and the third guide portions 45 do not need to exist simultaneously, so when the carrying member 2 pivots to the insulating body 1, fitting is more convenient, and positioning is more accurate.

(6) When the carrying member 2 carries the chip module 9 to pivot down to the insulating body 1, as the carrying member 2 presses down, the carrying member 2 is switched from an assembling state to a buffer state, the assembling plane 71 moves and transits to the stopping plane 72, and when the stopping plane 72 contacts the buffer portion 6, the buffer portion 6 exerts a buffer force on the carrying member 2 to stop the carrying member 2 from continuously moving, thus reducing the down pressure of the carrying member 2, preventing the carrying member 2 from carrying the chip module 9 to directly hit against the terminals 11 on the insulating body 1, and reducing the risk of misoperation.

(7) The two limiting portions 83 are arranged on the carrying member 2, the pivoting shaft 7 is arranged on the positioning member 5, and the pivoting shaft 7 is pivoted to the pivoting space 84 enclosed by the two limiting portions 83. Compared with the existing complicated pivoting device, the positioning member 5 is of an integrated type, spare parts are eliminated, and the pivoting mode is more convenient in assembly on a small-space electrical connector, reduces the assembling difficulty, and reduces the cost.

(8) The buffer portion 6 is located opposite to the positioning member 5, and has a main body portion 61 fixed to the base 4, two elastic arms 62 extend from the main body portion 61 to a direction toward the insulating body 1, and an elastic buffer arm 63 laterally extends up from each of the two elastic arms 62. When the carrying member 2 pivots to the insulating body 1, the elastic buffer arms 63 upwards abut against the carrying member 2 to exert a buffer force on the carrying member 2, thus preventing the carrying member 2 from suddenly damaging the terminals 11 on the insulating body 1, and reducing the risk resulting from misoperation.

(9) The buffer portion 6 may also be arranged on the long side of the carrying member 2 which is away from the pivoting side. Specifically, two elastic buffer arms 63 extend toward each other along the long side, and when the carrying member 2 pivots to the insulating body 1, the elastic buffer arms 63 abut against the insulating body 1 to buffer the down pressing of the carrying member 2, thus preventing the carrying member 2 from suddenly damaging the terminals 11 on the insulating body 1, and reducing the risk resulting from misoperation.

(10) The positioning member 5 has multiple soldering portions 53, the positioning member 5 and the base 4 are fixed by laser soldering, solders are not needed, and soldering is more convenient.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector used for carrying a chip module, comprising:
    an insulating body having a plurality of terminals arranged in the insulating body and used for contacting the chip module;
    a carrying member used for carrying the chip module to the insulating body;
    a pressing plate used for pressing the carrying member or the chip module; and
    a positioning member, pivoted to the carrying member through a pivoting device comprising
        a pivoting shaft; and
        at least one elastic portion comprising
            a first elastic section; and
            at least two limiting portions being elastic and enclosing a pivoting space, wherein the pivoting shaft is pivoted to the pivoting space.

2. The electrical connector of claim 1, wherein an elastic deformation direction of the limiting portions is different from that of the first elastic section.

3. The electrical connector of claim 1, wherein the limiting portions elastically deforms in lateral directions, and the first elastic section elastically deforms in a vertical direction.

4. The electrical connector of claim 1, wherein the two limiting portions are arranged in a mutually staggered manner.

5. The electrical connector of claim 1, wherein the two limiting portions are arranged opposite to each other, each of the limiting portions has an arc-shaped surface, and the two arc-shaped surfaces enclose the pivoting space.

6. The electrical connector of claim 1, wherein the elastic portion is formed by extending from the positioning member, and the pivoting shaft is located on the carrying member.

7. The electrical connector of claim 6, wherein the first elastic section extends from the positioning member, and the first elastic section is connected to the two limiting portions.

8. The electrical connector of claim 6, wherein the elastic portion has a second elastic section extending from the positioning member, bending and extending along a first vertical direction from the first elastic portion, and being connected to the first elastic section and the two limiting portions.

9. The electrical connector of claim 8, wherein a bending portion is formed by bending and extending from the positioning member along a second vertical direction opposite to the first vertical direction, the first elastic portion horizontally extends from the bending portion, the second elastic portion bends and extends from the first elastic section along the first vertical direction, and the two limiting portions are horizontally arranged with an interval between the two limiting portions at a tail end of the second elastic portion.

10. The electrical connector of claim 6, wherein the positioning member has a buffer portion, the buffer portion abuts against the pivoting shaft.

11. The electrical connector of claim 10, wherein the pivoting shaft has an assembling plane and a stopping plane adjacent to each other, the carrying member has an assembling state and a buffer state, when the carrying member is in the assembling state, the assembling plane abuts against the buffer portion, and when the carrying member is in the buffer state, the stopping plane abuts against the buffer portion.

12. The electrical connector of claim 10, wherein the buffer portion is located between the insulating body and the carrying member.

13. The electrical connector of claim 10, wherein an elastic connecting section is formed by extending from the positioning member, and the buffer portion is connected to the elastic connecting section.

14. The electrical connector of claim 13, wherein a bending portion is formed by bending and extending from the positioning member along a first vertical direction, the elastic connecting portion horizontally extends from the bending portion, the buffer portion is formed by bending from the elastic connecting section along a second vertical direction opposite to the first vertical direction, and the elastic connecting section is connected to the bending portion and the buffer portion.

15. The electrical connector of claim 14, wherein the buffer portion bends and extends from the elastic connecting section along a lateral direction away from the positioning member.

16. The electrical connector of claim 6, wherein the pivoting device comprises two elastic portions, the positioning member has a buffer portion, and the buffer portion is located between the two elastic portions and abuts against the pivoting shaft.

17. The electrical connector of claim 6, wherein a buffer portion and the elastic portion are formed by extending from the same positioning member, respectively.

18. The electrical connector of claim 1, wherein the elastic portion is formed by extending from the carrying member, the pivoting shaft is formed by extending from the positioning member, the first elastic section extends from the carrying member, and the first elastic section is connected to the limiting portion.

19. The electrical connector of claim 18, wherein the elastic portion comprises two first elastic sections extending toward each other from two sides of the carrying member, respectively, and extension directions of the two first elastic sections are perpendicular to a rotating direction of the carrying member.

20. The electrical connector of claim 18, wherein the positioning member bends and extends along a vertical direction to form a bending portion, an elastic connecting portion extends horizontally from the bending portion, and the elastic connecting portion bends and extends to form the pivoting shaft.

21. The electrical connector of claim 1, wherein the carrying member has a buffer portion abutting against the insulating body, located on a side of the carrying member away from the elastic portion, and comprising two elastic buffer arms abutting against the insulating body.

22. The electrical connector of claim 1, wherein a base is arranged at the periphery of the insulating body, the positioning member is soldered and fixed to the base, and a buffer portion is fixed to the base and located opposite to the positioning member, and abuts against the carrying member.

23. The electrical connector of claim 22, wherein the buffer portion has a main body portion, the main body portion is fixed to the base, two elastic arms extend from the main body portion along a direction toward the insulating body, an elastic buffer arm extends from the elastic arm along a vertical direction, and the elastic buffer arm abuts against the carrying member.

24. The electrical connector of claim 1, wherein the pressing plate and the carrying member are located on two adjacent sides of the periphery of the insulating body, respectively.

25. The electrical connector of claim 1, wherein the pressing plate has two opposite long sides and two opposite short sides, one of the short sides of the pressing plate serves as a pivoting side, the carrying member has two opposite long sides and two opposite short sides, and one of the long sides of the carrying member serves as a pivoting side.

26. The electrical connector of claim 1, wherein a side of the carrying member away from the pivoting side is provided with at least one first guide portion fitting an outer wall surface of the insulating body and guiding the carrying member to the insulating body.

27. The electrical connector of claim 1, wherein the carrying member is provided with at least one second guide portion on each of two opposite short sides of the carrying member, the second guide portions fits an outer wall surface of the insulating body and guides the carrying member to the insulating body.

28. The electrical connector of claim 1, wherein a base is arranged at the periphery of the insulating body, a first reinforcing member and a second reinforcing member are fixed to the base, the second reinforcing member is located on a first side of the base opposite to a second side of the base where the first reinforcing member is located, a first lever is pivoted to the first reinforcing member, a second lever is pivoted to the second reinforcing member, the pressing plate is pivoted to the first lever, the pressing plate has a projecting portion, the second lever is configured to press the projecting portion, two third guide portions extend from the first reinforcing member and the second reinforcing member, respectively, and the third guide portions fit an outer wall surface of the carrying member and guide the carrying member to be pressed to the insulating body.

29. An electrical connector used for carrying a chip module, comprising:
an insulating body having a plurality of terminals arranged in the insulating body and used for contacting the chip module;
a carrying member used for carrying the chip module to the insulating body;
a pressing plate used for pressing the carrying member or the chip module; and
a positioning member, pivoted to the carrying member through a pivoting device comprising
an elastic portion having a pivoting space; and
a pivoting shaft, pivoted to the pivoting space, wherein when the pivoting shaft enters the pivoting space, the elastic portion elastically deforms for a first time, and when the pressing plate presses the carrying member or the chip module, the elastic portion elastically deforms for a second time.

30. The electrical connector of claim 29, wherein the elastic portion comprises a first elastic section and at least two limiting portions being elastic and enclosing the pivoting space.

31. The electrical connector of claim 30, wherein when the pivoting shaft is pressed against the limiting portions, the limiting portions elastically deform, and when the pressing plate presses the carrying member or the chip module, the first elastic section elastically deforms.

32. The electrical connector of claim 30, wherein an elastic deformation direction of the limiting portions is different from that of the first elastic section.

33. The electrical connector of claim 30, wherein the limiting portion laterally and elastically deforms, and the first elastic section elastically deforms in a vertical direction.

34. The electrical connector of claim 30, wherein the two limiting portions are oppositely arranged in a mutually staggered manner.

35. The electrical connector of claim 29, wherein the elastic portion is formed by extending from the positioning member, the pivoting shaft is arranged on the carrying member, the elastic portion comprises at least two limiting portions and a first elastic section extending from the positioning member and connected to the two limiting portions.

36. The electrical connector of claim 35, wherein the elastic portion has a second elastic section connected to the first elastic section and the limiting portions.

37. The electrical connector of claim 36, wherein a bending portion is formed by bending and extending from the positioning member along a first vertical direction, the first elastic portion horizontally extends from the bending portion, and the second elastic portion bends and extends from the first elastic section along a second vertical direction opposite to the first vertical direction.

38. The electrical connector of claim 29, wherein the positioning member has a buffer portion abutting against the pivoting shaft.

39. The electrical connector of claim 38, wherein the pivoting shaft has an assembling plane and a stopping plane adjacent to each other, the carrying member has an assembling state and a buffer state, when the carrying member is in the assembling state, the assembling plane abuts against the buffer portion, and when the carrying member is in the buffer state, the stopping plane abuts against the buffer portion.

40. The electrical connector of claim 38, wherein an elastic connecting section is formed by extending from the positioning member, and the buffer portion is connected to the elastic connecting section.

* * * * *